US008298454B2

(12) United States Patent
Lee et al.

(10) Patent No.: US 8,298,454 B2
(45) Date of Patent: *Oct. 30, 2012

(54) PHOTOSENSITIVE RESIN COMPOSITION AND LIGHT BLOCKING LAYER USING THE SAME

(75) Inventors: Chang-Min Lee, Uiwang-si (KR); Jun-Seok Kim, Uiwang-si (KR); Kil-Sung Lee, Uiwang-si (KR); Min-Sung Kim, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/241,434

(22) Filed: Sep. 23, 2011

(65) Prior Publication Data

US 2012/0145971 A1   Jun. 14, 2012

(30) Foreign Application Priority Data

Dec. 10, 2010   (KR) .................. 10-2010-0126486

(51) Int. Cl.
*G02B 5/23* (2006.01)
*C08F 2/50* (2006.01)
*C08F 2/46* (2006.01)
*C08J 3/28* (2006.01)
*G03F 7/033* (2006.01)
*G03F 7/032* (2006.01)

(52) U.S. Cl. ........... 252/586; 252/582; 430/270.1; 430/281.1; 430/286.1; 430/287.1; 430/293; 522/71; 522/74; 522/79; 522/80; 522/81; 522/101; 522/103; 522/104; 522/113; 522/120; 522/123; 522/149; 522/153; 522/154; 522/178; 522/182; 522/183; 524/99

(58) Field of Classification Search ............ 252/586, 252/582; 430/7, 270.1, 281.1, 286.1, 287.1, 430/293; 522/33, 42, 46, 53, 63, 78, 79, 522/182, 71, 74, 80, 81, 101, 103, 104, 113, 522/120, 123, 149, 153, 154, 178, 183; 524/99
See application file for complete search history.

(56) References Cited

U.S. PATENT DOCUMENTS

| | | | |
|---|---|---|---|
| 4,500,897 A | 2/1985 | Matsuda et al. | |
| 4,762,752 A | 8/1988 | Haubennestel et al. | |
| 5,424,167 A | 6/1995 | Uetani et al. | |
| 5,707,432 A | 1/1998 | Adams et al. | |
| 5,708,055 A | 1/1998 | Joyce et al. | |
| 5,710,234 A | 1/1998 | Fujishiro et al. | |
| 5,721,076 A | 2/1998 | Wantanabe et al. | |
| 5,803,959 A | 9/1998 | Johnson et al. | |
| 5,851,280 A | 12/1998 | Belmont et al. | |
| 5,895,522 A | 4/1999 | Belmont et al. | |
| 5,922,118 A | 7/1999 | Johnson et al. | |
| 5,968,243 A | 10/1999 | Belmont et al. | |
| 6,110,994 A | 8/2000 | Cooke et al. | |
| 6,232,025 B1 | 5/2001 | Srinivasan | |
| 6,277,183 B1 | 8/2001 | Johnson et al. | |
| 6,328,894 B1 | 12/2001 | Chan et al. | |
| 6,780,389 B2 | 8/2004 | Karl et al. | |
| 6,960,250 B2 | 11/2005 | Luethge et al. | |
| 7,132,154 B2 | 11/2006 | Shibahara et al. | |
| 7,250,209 B2 | 7/2007 | Shibahara et al. | |
| 7,376,328 B2 | 5/2008 | Takase et al. | |
| 7,592,119 B2 | 9/2009 | Nomura | |
| 7,794,917 B2 | 9/2010 | Mori et al. | |
| 2002/0187412 A1 | 12/2002 | You et al. | |
| 2004/0126592 A1 | 7/2004 | Shibahara et al. | |
| 2005/0164120 A1 | 7/2005 | Yamaoka et al. | |
| 2006/0041053 A1 | 2/2006 | Kamata et al. | |
| 2007/0101903 A1 | 5/2007 | Lee et al. | |
| 2007/0161110 A1 | 7/2007 | Iida et al. | |
| 2008/0090177 A1 | 4/2008 | Oh et al. | |
| 2009/0182079 A1 | 7/2009 | Lee et al. | |
| 2009/0207490 A1 | 8/2009 | Moriyama et al. | |
| 2010/0085518 A1 | 4/2010 | Choi et al. | |
| 2010/0163811 A1* | 7/2010 | Oh et al. ................ 252/586 |
| 2010/0227178 A1* | 9/2010 | Oouchi et al. ............ 428/451 |
| 2012/0091407 A1 | 4/2012 | Lee et al. | |

FOREIGN PATENT DOCUMENTS

CN   1606597   4/2005
(Continued)

OTHER PUBLICATIONS

Office Action in commonly owned U.S. Appl. No. 11/473,876, mailed on Dec. 18, 2008, pp. 1-14.
(Continued)

*Primary Examiner* — Bijan Ahvazi
(74) *Attorney, Agent, or Firm* — Summa, Additon & Ashe, P.A.

(57) ABSTRACT

Disclosed are a photosensitive resin composition and a light blocking layer using the same. The photosensitive resin composition includes (A) a cardo-based monomer represented by the following Chemical Formula 1 or 2, wherein the substituents of Chemical Formula 1 and Chemical Formula 2 are the same as defined in the detailed description, (B) a cardo-based resin, (C) a reactive unsaturated compound, (D) a pigment, (E) an initiator, and (F) a solvent.

[Chemical Formula 1]

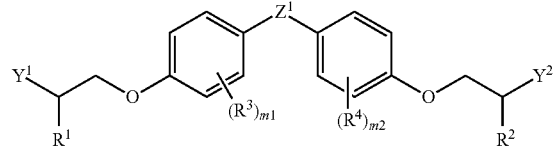

[Chemical Formula 2]

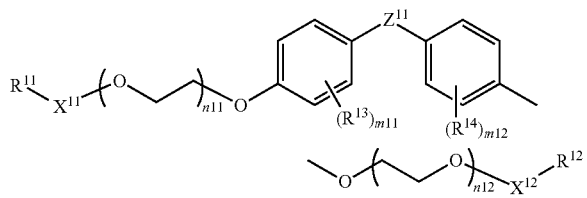

18 Claims, 5 Drawing Sheets

FOREIGN PATENT DOCUMENTS

| | | |
|---|---|---|
| CN | 1606600 | 4/2005 |
| EP | 1471112 A1 | 10/2004 |
| JP | 60237403 | 11/1985 |
| JP | 1152449 | 6/1989 |
| JP | 1200353 | 8/1989 |
| JP | 4007373 | 1/1992 |
| JP | 4091173 | 3/1992 |
| JP | 4163552 | 6/1992 |
| JP | 05-339356 A | 12/1993 |
| JP | 06-001938 A | 1/1994 |
| JP | 07-064281 A | 3/1995 |
| JP | 07-64282 | 3/1995 |
| JP | 08-278630 A | 10/1996 |
| JP | 09-022653 A | 1/1997 |
| JP | 09-291224 | 11/1997 |
| JP | 09-304929 | 11/1997 |
| JP | 10-010311 A | 1/1998 |
| JP | 10-067970 | 3/1998 |
| JP | 10-204321 A | 8/1998 |
| JP | 10218973 A | 8/1998 |
| JP | 10-253820 A | 9/1998 |
| JP | 10-510861 | 10/1998 |
| JP | 11-060989 A | 3/1999 |
| JP | 11-231523 | 8/1999 |
| JP | 2000-056120 | 2/2000 |
| JP | 2000-171969 A | 6/2000 |
| JP | 2001-131241 | 5/2001 |
| JP | 2002-145999 | 5/2002 |
| JP | 3287661 B2 | 6/2002 |
| JP | 2003-066597 | 3/2003 |
| JP | 2003-149810 | 5/2003 |
| JP | 2004-004762 A | 1/2004 |
| JP | 2004-029745 A | 1/2004 |
| JP | 2004-186227 | 7/2004 |
| JP | 2004-198717 A | 7/2004 |
| JP | 2004-251946 A | 9/2004 |
| JP | 2004-292672 A | 10/2004 |
| JP | 2004-075985 A | 11/2004 |
| JP | 2005-215149 | 8/2005 |
| KR | 1019910004717 | 7/1991 |
| KR | 1019920005780 | 7/1992 |
| KR | 1019940005617 | 6/1994 |
| KR | 94-7778 | 8/1994 |
| KR | 10-1995-7002313 | 6/1995 |
| KR | 95-11163 | 9/1995 |
| KR | 95-7003746 | 9/1995 |
| KR | 96-11513 | 1/1999 |
| KR | 93-700858 | 7/2000 |
| KR | 10-0264691 A | 9/2000 |
| KR | 95-700359 | 1/2001 |
| KR | 92-702502 | 12/2002 |
| KR | 2003-057090 | 7/2003 |
| KR | 96-29904 | 5/2004 |
| KR | 10-2006-0041154 A | 5/2006 |
| KR | 10-2006-0070772 A | 6/2006 |
| KR | 10-2006-0076412 A | 7/2006 |
| KR | 10-0725023 B1 | 5/2007 |
| KR | 10-2009-0026037 A | 3/2009 |
| KR | 10-2010-0047648 A | 5/2010 |
| KR | 10-2010-0053090 A | 5/2010 |
| KR | 10-2010-0053476 A | 5/2010 |
| WO | 2004/055597 A1 | 7/2004 |
| WO | 2006/044676 A2 | 4/2006 |
| WO | 2008047992 A1 | 4/2008 |
| WO | 2010/050650 A1 | 5/2010 |

OTHER PUBLICATIONS

Notice of Allowance in commonly owned U.S. Appl. No. 11/473,876, mailed on Jul. 17, 2009, pp. 1-6.
International Search Report in commonly owned International Application No. PCT/KR2007/002908, dated Sep. 21, 2007, pp. 1-2.
English Translation of Abstract for Korean Patent Application No. 92-702502.
English Translation of Abstract for Korean Patent Application No. 93-700858.
English Translation of Abstract for Korean Patent Application No. 94-7778.
English Translation of Abstract for Korean Patent Application No. 95-11163.
English Translation of Abstract for Korean Patent Application No. 95-700359.
English Translation of Abstract for Korean Patent Application No. 95-703746.
English Translation of Abstract for Korean Patent Application No. 96-11513.
English Translation of Abstract for Korean Patent Application No. 96-29904.
Machine Translation of JP 07064282 A, pp. 1-23.
Machine Translation of KR 2003057090 A, pp. 1-14.
Office Action in commonly owned copending U.S. Appl. No. 12/323,554, mailed on Jun. 24, 2009, pp. 1-25.
English abstract of JP 2004-292672, published Oct. 21, 2004, pp. 1-3.
English abstract of JP 10-204321, published Aug. 4, 1998, pp. 1-3.
English abstract of JP 2004-251946, published Sep. 9, 2004, pp. 1-4.
English abstract of JP 2004-029745, published Jan. 29, 2004, pp. 1-4.
English abstract of JP 2004-004762, published Jan. 8, 2004, pp. 1-4.
English abstract of JP 2004-075985, published Mar. 11, 2004, pp. 1-5.
English abstract of JP 2004-198717, published Jul. 15, 2004, pp. 1-6.
English abstract of JP 10-253820, published Sep. 25, 1998, pp. 1-3.
English abstract of JP 10-010311, published Jan. 16, 1998, pp. 1-3.
English abstract of JP 11-060989, published Mar. 5, 1999, pp. 1-2.
English abstract of JP 09-022653, published Jan. 21, 1997, pp. 1-2.
Office Action in commonly owned U.S. Appl. No. 11/747,313 mailed Jun. 13, 2011, pp. 1-6.
Office Action in commonly owned U.S. Appl. No. 11/747,313 mailed Nov. 23, 2011, pp. 1-6.
Office Action in commonly owned U.S. Appl. No. 11/747,313 mailed Dec. 22, 2010, pp. 1-4.
Notice of Allowance in commonly owned U.S. Appl. No. 11/747,313 mailed Mar. 13, 2012, pp. 1-9.
Office Action in commonly owned U.S. Appl. No. 12/504,409 mailed on Nov. 18, 2010, pp. 1-12.
Taiwanese Office Action in commonly owned Taiwanese Application No. 095144145 dated Jun. 4, 2010, pp. 1-5.
English translation of Taiwanese Search Report in commonly owned Taiwanese Application No. 095144145 dated May 11, 2010, pp. 1.
Office Action in commonly owned U.S. Appl. No. 12/323,554 mailed Dec. 29, 2009, pp. 1-18.
Office Action in commonly owned U.S. Appl. No. 13/217,581 mailed Jan. 6, 2012, pp. 1-16.
Office Action in commonly owned U.S. Appl. No. 13/161,542 mailed Jan. 6, 2012, pp. 1-14.

* cited by examiner

PHOTOSENSITIVE RESIN COMPOSITION AND LIGHT BLOCKING LAYER USING THE SAME

CROSS-REFERENCE TO RELATED APPLICATION

This application claims priority under 35 USC Section 119 to and the benefit of Korean Patent Application No. 10-2010-0126486 filed in the Korean Intellectual Property Office on Dec. 10, 2010, the entire disclosure of which is incorporated herein by reference.

FIELD OF THE INVENTION

The present invention relates to a photosensitive resin composition including a cardo-based monomer and a light blocking layer using the same.

BACKGROUND

A liquid crystal display device typically includes a lower substrate including a light blocking layer, a color filter, and an ITO pixel electrode; an active circuit portion including a liquid crystal layer, a thin film transistor, and a capacitor layer; and an upper substrate including an ITO pixel electrode.

The light blocking layer blocks uncontrolled light transmitted out of a transparent pixel electrode of a substrate to prevent contrast reduction by the light transmitted through a thin film transistor. Red, green and blue light blocking layers transmit light with a predetermined wavelength of white light and display colors.

The light blocking layer is generally fabricated using a pigment dispersion method. The pigment dispersion method includes coating a transparent substrate with a colorant-containing photopolymerizable composition, exposing the coating to provide a pattern by thermal curing, and removing non-exposed portions with a solvent.

When a photosensitive polyimide or phenol-based resin is used as a binder resin in the pigment dispersion method, high heat resistance may be obtained but sensitivity can be reduced and an organic solvent is required as a development solvent. A photoresist using an azide compound can have low sensitivity and heat resistance and may be affected by oxygen during exposure.

An acrylic-based resin can also be used as a binder resin in the pigment dispersion method. An acrylic-based resin can have good heat resistance, shrinkage-resistance, chemical resistance, and the like, but also can have reduced sensitivity, developability, and close contacting (adhesion) properties. Since black pigments are included in a large amount in order to adjust optical density of a light blocking layer, sensitivity, development properties, and close contacting properties may also be significantly deteriorate.

SUMMARY

One embodiment of the present invention provides a photosensitive resin composition that can have excellent sensitivity, developability, close contacting properties, heat resistance, shrink resistance, chemical resistance, and taper characteristics.

Another embodiment of the present invention provides a light blocking layer fabricated using the photosensitive resin composition.

According to one embodiment of the present invention, a photosensitive resin composition is provided that includes (A) a cardo-based monomer represented by the following Chemical Formula 1 or 2 or a combination thereof; (B) a cardo-based resin; (C) a reactive unsaturated compound; (D) a pigment; (E) an initiator; and (F) a solvent.

[Chemical Formula 1]

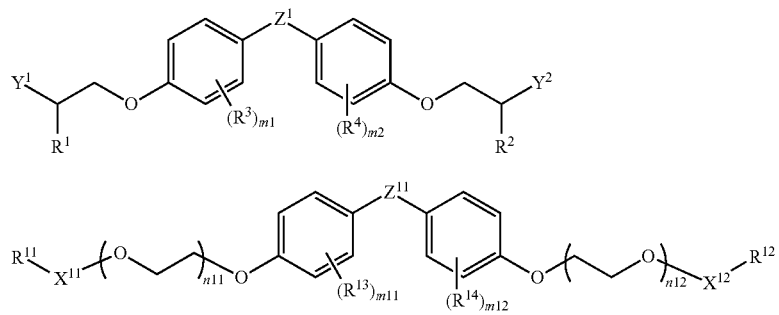

[Chemical Formula 2]

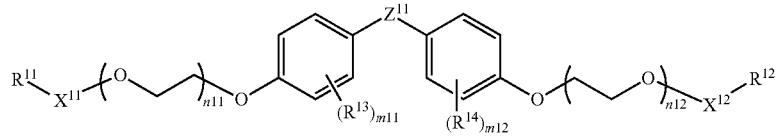

In Chemical Formulae 1 and 2, $R^1$, $R^2$, $R^{11}$ and $R^{12}$ are the same or different and are independently an organic group including a substituted or unsubstituted (meth)acrylate group, $R^3$, $R^4$, $R^{13}$ and $R^{14}$ are the same or different and are independently hydrogen, halogen, or substituted or unsubstituted C1 to C20 alkyl, $Z^1$ and $Z^{11}$ are the same or different and are independently a single bond, O, CO, $SO_2$, $CR^6R^7$, $SiR^8R^9$ (wherein $R^6$ to $R^9$ are the same or different and are independently hydrogen or substituted or unsubstituted C1 to C20 alkyl), or a linking group represented by the following Chemical Formula 4-1 to 4-11, $Y^1$ and $Y^2$ are the same or different and are independently hydroxy, a substituted or unsubstituted (meth)acrylate group, or an organic group including a carboxyl group, $X^{11}$ and $X^{12}$ are the same or different and are independently a linking group represented by the following Chemical Formula 7, $m^1$, $m^2$, $m^{11}$ and $m^{12}$ are the same or different and are independently integers ranging from 0 to 4, and $n^{11}$ and $n^{12}$ are the same or different and are independently integers ranging from 1 to 10.

[Chemical Formula 4-1]

[Chemical Formula 4-2]

[Chemical Formula 4-3]

[Chemical Formula 4-4]

[Chemical Formula 4-5]

In Chemical Formula 4-5,

R$^a$ is hydrogen, ethyl, $C_2H_4Cl$, $C_2H_4OH$, $CH_2CH=CH_2$, or phenyl.

[Chemical Formula 4-6]

[Chemical Formula 4-7]

[Chemical Formula 4-8]

[Chemical Formula 4-9]

[Chemical Formula 4-10]

[Chemical Formula 4-11]

[Chemical Formula 7]

In Chemical Formula 7, $A^1$, $A^2$ and $A^3$ are the same or different and are independently carbon or nitrogen, and R' is hydrogen, halogen, hydroxy, substituted or unsubstituted C1 to C20 alkyl, amine, C1 to C20 alkylamine, or C2 to C20 alkylamine.

In Chemical Formulae 1 and 2, $R^1$, $R^2$, $R^{11}$ and $R^{12}$ may respectively include at least one of the substituents represented by the following Chemical Formulae 3-1 to 3-3.

[Chemical Formula 3-1]

[Chemical Formula 3-2]

[Chemical Formula 3-3]

In Chemical Formulae 3-1 to 3-3, $R^{10}$ to $R^{18}$ are the same or different and are independently a substituted or unsubstituted (meth)acrylate group, and $n^3$ is an integer ranging from 0 to 3.

The organic group including a carboxyl group may include the substituent represented by the following Chemical Formula 5.

[Chemical Formula 5]

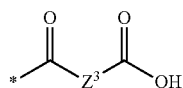

In Chemical Formula 5, $Z^3$ is a linking group represented by following Chemical Formulae 6-1 to 6-7.

[Chemical Formula 6-1]

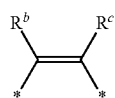

In Chemical Formula 6-1, $R^b$ and $R^c$ are the same or different and are independently hydrogen, substituted or unsubstituted C1 to C20 alkyl, ester, or ether.

[Chemical Formula 6-2]

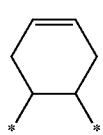

[Chemical Formula 6-3]

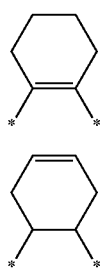

[Chemical Formula 6-4]

[Chemical Formula 6-5]

In Chemical Formula 6-5, $R^d$ is O, S, NH, substituted or unsubstituted C1 to C20 alkyl, C1 to C20 alkylamine, or C2 to C20 alkylamine.

[Chemical Formula 6-6]

[Chemical Formula 6-7]

The cardo-based monomer (A) may include one of the monomers represented by the following Chemical Formulae 8-1 to 0.8-6 or a combination thereof.

[Chemical Formula 8-1]

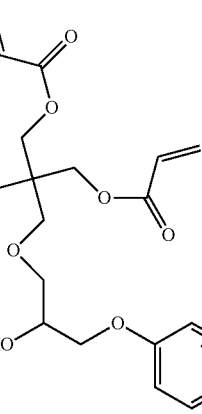

[Chemical Formula 8-2]

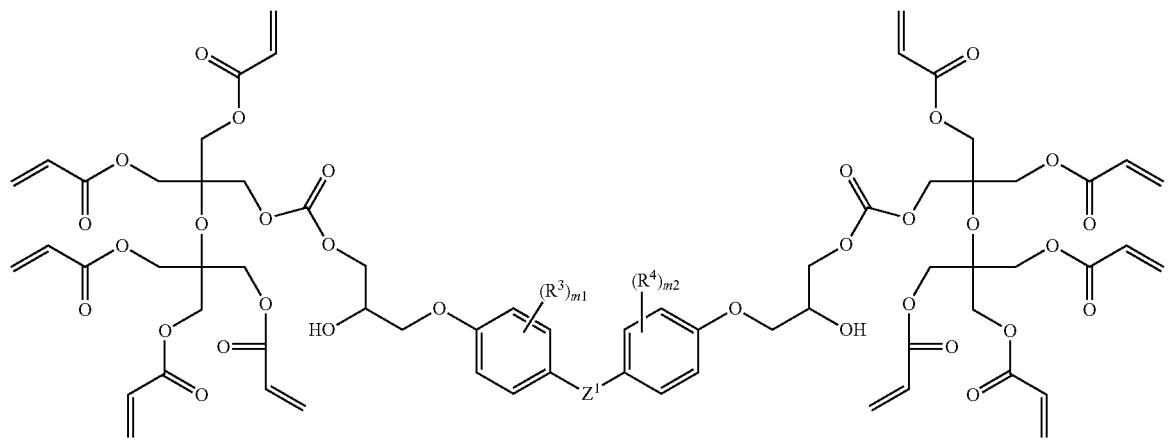

[Chemical Formula 8-3]
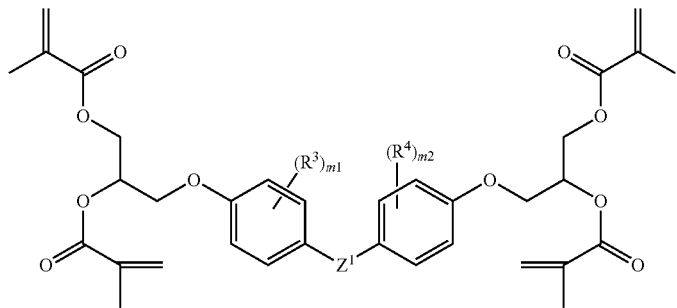
[Chemical Formula 8-4]
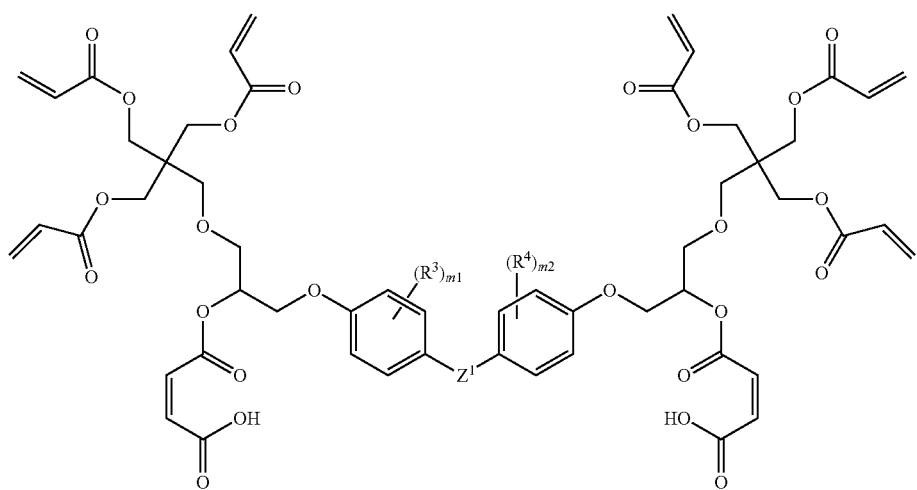
[Chemical Formula 8-5]
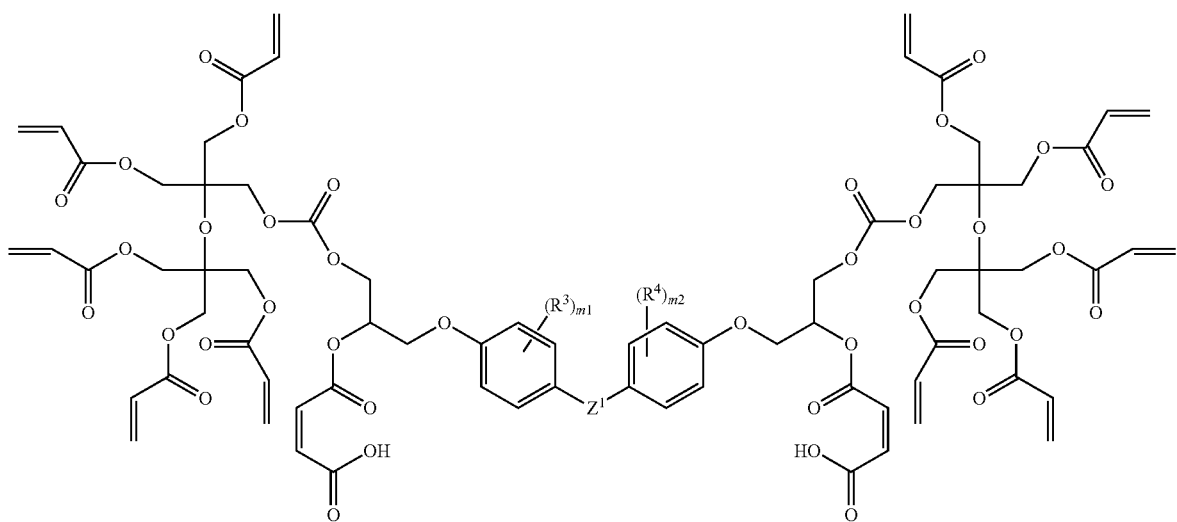

-continued

[Chemical Formula 8-6]

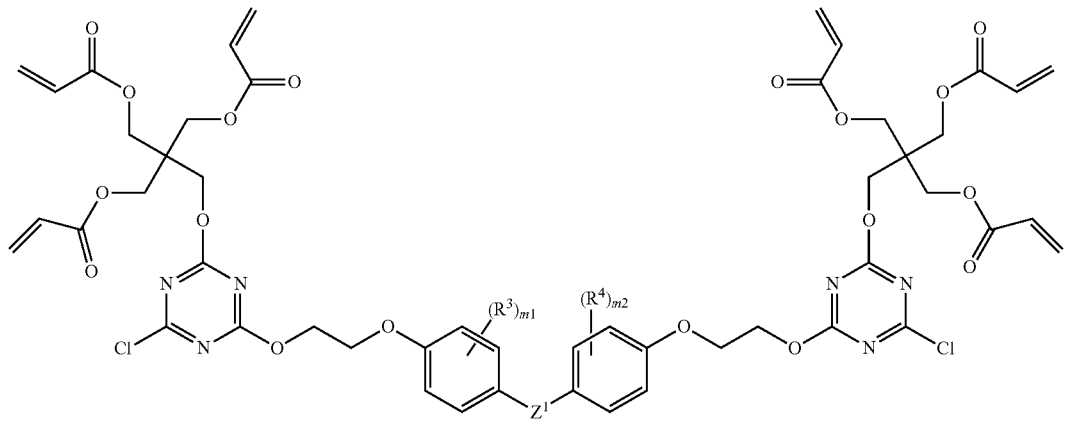

In Chemical Formulae 8-1 to 8-6, $R^3$ and $R^4$ are the same or different and are independently hydrogen, halogen, or substituted or unsubstituted C1 to C20 alkyl, $Z^1$ is a single bond, O, CO, $SO_2$, $CR^6R^7$, $SiR^8R^9$ (wherein $R^6$ to $R^9$ are the same or different and are independently hydrogen or substituted or unsubstituted C1 to C20 alkyl), or a linking group represented by Chemical Formula 4-1 to 4-11 defined above, and $m^1$ and $m^2$ are the same or different and are independently integers ranging from 0 to 4.

The cardo-based resin (B) may be a polymer including the repeating unit represented by the following Chemical Formula 9.

[Chemical Formula 9]

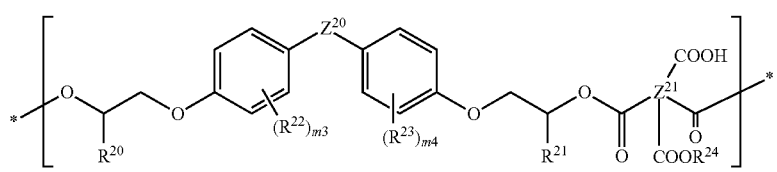

In Chemical Formula 9, $R^{20}$ and $R^{21}$ are the same or different and are independently hydrogen or substituted or unsubstituted (meth)acrylate, $R^{22}$ and $R^{23}$ are the same or different and are independently hydrogen, halogen, or substituted or unsubstituted C1 to C20 alkyl, $R^{24}$ is hydrogen, substituted or unsubstituted C1 to C20 alkyl, or substituted or unsubstituted (meth)acrylate, $Z^{20}$ is a single bond, O, CO, $SO_2$, $CR^{25}R^{26}$, $SiR^{27}R^{28}$ (wherein $R^{25}$ to $R^{28}$ are the same or different and are independently hydrogen or substituted or unsubstituted C1 to C20 alkyl), or a linking group represented by the following Chemical Formula 10-1 to 10-11, and $Z^{21}$ is an acid anhydride residual group or an acid dianhydride residual group.

[Chemical Formula 10-1]

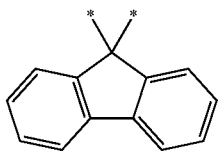

[Chemical Formula 10-2]

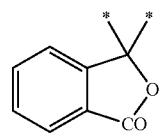

-continued

[Chemical Formula 10-3]

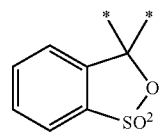

[Chemical Formula 10-4]

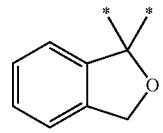

[Chemical Formula 10-5]

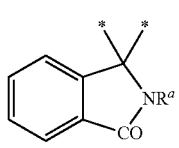

In Chemical Formula 10-5,
$R^a$ is hydrogen, ethyl, $C_2H_4Cl$, $C_2H_4OH$, $CH_2CH=CH_2$, or phenyl.

[Chemical Formula 10-6]

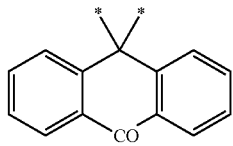

[Chemical Formula 10-7]

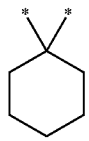

[Chemical Formula 10-8]

[Chemical Formula 10-9]

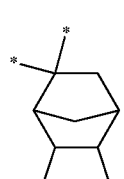

[Chemical Formula 10-10]

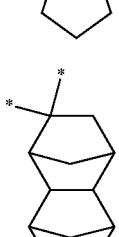

[Chemical Formula 10-11]

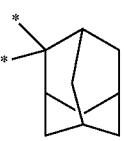

The cardo-based resin (B) may have a weight average molecular weight of about 500 to about 50,000 g/mol.

The photosensitive resin composition may include about 1 to about 30 wt % of the cardo-based monomer (A); about 1 to about 30 wt % of the cardo-based resin (B); about 1 to about 30 wt % of the reactive unsaturated compound (C); about 1 to about 30 wt % of the pigment (D); about 0.01 to about 10 wt % of the initiator (E); and a balance amount of the solvent (F).

The photosensitive resin composition may further include an acrylic-based resin. The acrylic-based resin may include a copolymer of a first ethylenic unsaturated monomer, such as but not limited to (meth)acrylic acid, maleic acid, itaconic acid, fumaric acid, or a combination thereof; and a second ethylenic unsaturated monomer, such as but not limited to styrene, α-methylstyrene, vinyltoluene, vinylbenzylmethylether, methyl(meth)acrylate, ethyl(meth)acrylate, butyl (meth)acrylate, 2-hydroxyethyl(meth)acrylate, 2-hydroxy butyl(meth)acrylate, benzyl(meth)acrylate, cyclohexyl (meth)acrylate, phenyl(meth)acrylate, 2-aminoethyl(meth) acrylate, 2-dimethylaminoethyl(meth)acrylate, vinyl acetate, vinyl benzoate, glycidyl(meth)acrylate, (meth)acrylonitrile, (meth)acrylamide, or a combination thereof.

The acrylic-based resin may have a weight average molecular weight of about 3,000 to about 40,000 g/mol.

The cardo-based resin and acrylic-based resin may be included at a weight ratio of about 99:1 to about 1:99.

The initiator may include a photopolymerization initiator, a radical polymerization initiator, or a combination thereof.

The photosensitive resin composition may further include about 0.01 to about 5 parts by weight of an epoxy compound, based on about 100 parts by weight of the photosensitive resin composition.

According to another embodiment of the present invention, a light blocking layer manufactured using the photosensitive resin composition is provided.

Hereinafter, other embodiments will be described in detail.

The photosensitive resin composition can have excellent sensitivity, developability, close contacting properties, heat resistance, shrinkage resistance, chemical resistance and taper properties, and may be useful in the production of a light blocking layer, color filter, and the like of a liquid crystal display device.

DETAILED DESCRIPTION

Figure 1:
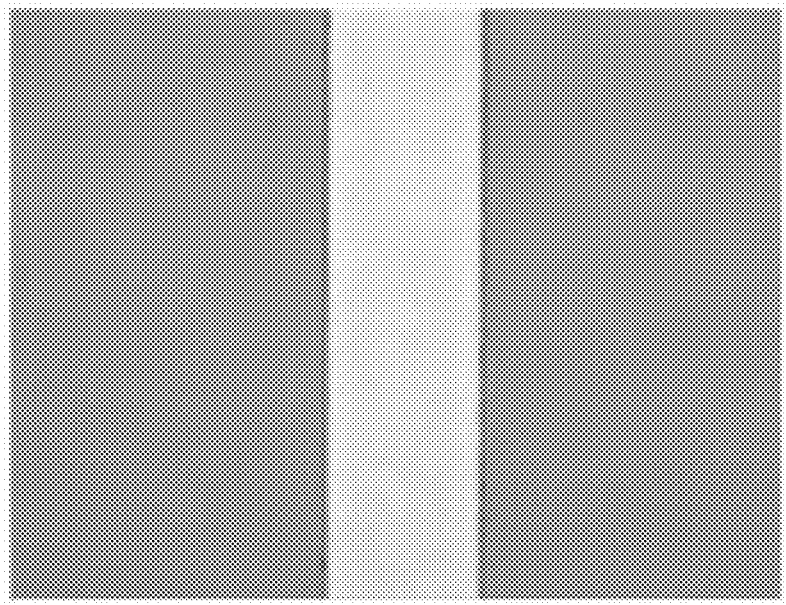
FIG. 1 is an optical microscope photograph of a shape of a pattern obtained from the photosensitive resin composition according to Example 1.

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "substituted" refers to one substituted with a substituent including halogen (F, Cl, Br or I), hydroxyl, C1 to C20 alkoxy, nitro, cyano, amine, imino group, azido group, amidino, hydrazino, hydrazono, carbonyl, carbamyl, thiol, ester, ether, carboxyl or a salt thereof, sulfonic acid or a salt thereof, phosphoric acid or a salt thereof, C1 to C20 alkyl, C2 to C20 alkenyl, C2 to C20 alkynyl, C6 to C30 aryl, C3 to C20 cycloalkyl, C3 to C20 cycloalkenyl, C3 to C20 cycloalkynyl, C2 to C20 heterocycloalkyl, C2 to C20 heterocycloalkenyl, C2 to C20 heterocycloalkynyl, C3 to C30 heteroaryl, or a combination thereof, in place of at least one hydrogen.

As used herein, when a specific definition is not otherwise provided, the term "hetero" may refer to a cyclic group including at least one heteroatom comprising N, O, S, P, or a combination thereof.

As used herein, when a specific definition is not otherwise provided, "(meth)acrylate" refers to both "acrylate" and "methacrylate", and "(meth)acrylic acid" refers to "acrylic acid" and "methacrylic acid".

The photosensitive resin composition according to one embodiment includes (A) a cardo-based monomer, (B) a cardo-based resin, (C) a reactive unsaturated compound, (D) a pigment, (E) an initiator and (F) a solvent.

Hereinafter, each component is described in detail.

(A) Cardo-Based Monomer

The cardo-based monomer may be represented by the following Chemical Formula 1 or 2, or a combination thereof.

[Chemical Formula 1]

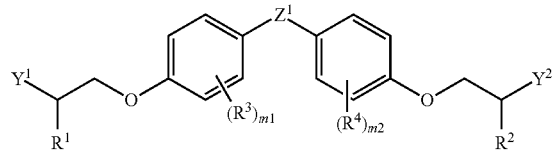

[Chemical Formula 2]

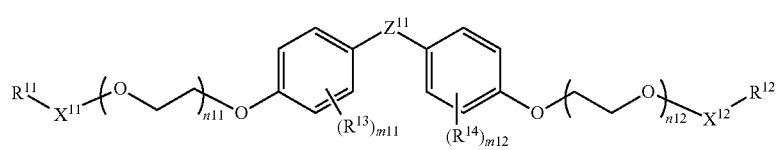

In Chemical Formulae 1 and 2, $R^1$, $R^2$, $R^{11}$ and $R^{12}$ are the same or different and are independently an organic group including a substituted or unsubstituted (meth)acrylate group.

The cardo-based monomer may have excellent compatibility when it is included in the photosensitive resin composition and may improve developability, sensitivity, close contacting property and mechanical strength by including a (meth)acrylate group at positions $R^1$, $R^2$, $R^{11}$ and $R^{12}$ of Chemical Formulae 1 and 2. In addition, the cardo-based monomer can provide excellent heat resistance and light resistance, so that the photosensitive resin composition can be used at a high temperature.

Examples of $R^1$, $R^2$, $R^{11}$ and $R^{12}$ include without limitation at least one substituent, or a combination thereof, represented by the following Chemical Formulae 3-1 to 3-3.

[Chemical Formula 3-1]

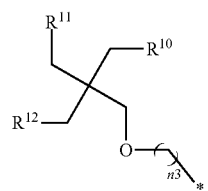

[Chemical Formula 3-2]

[Chemical Formula 3-3]

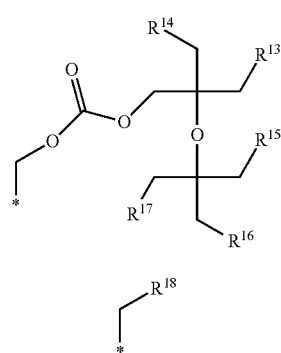

In Chemical Formulae 3-1 to 3-3, $R^{10}$ to $R^{18}$ are the same or different and are independently a substituted or unsubstituted (meth)acrylate group, and $n^3$ is an integer ranging from 0 to 3.

In Chemical Formulae 1 and 2, $R^3$, $R^4$, $R^{13}$ and $R^{14}$ are the same or different and are independently hydrogen, halogen, substituted or unsubstituted C1 to C20 alkyl, and the like.

In Chemical Formulae 1 and 2, $Z^1$ and $Z^{11}$ are the same or different and are independently a single bond, O, CO, $SO_2$, $CR^6R^7$, $SiR^6R^9$ (wherein $R^6$ to $R^9$ are the same or different and are independently hydrogen or substituted or unsubstituted C1 to C20 alkyl), or a linking group represented by the following Chemical Formula 4-1 to 4-11.

[Chemical Formula 4-1]

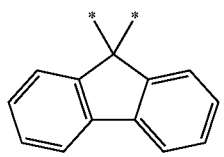

[Chemical Formula 4-2]

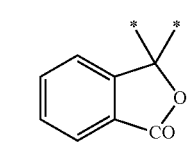

[Chemical Formula 4-3]

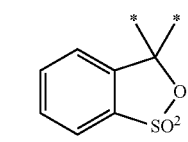

[Chemical Formula 4-4]

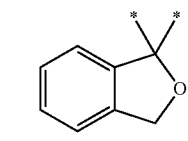

[Chemical Formula 4-5]

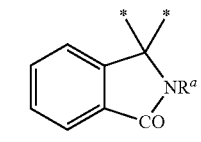

In Chemical Formula 4-5, $R^a$ is hydrogen, ethyl, $C_2H_4Cl$, $C_2H_4OH$, $CH_2CH=CH_2$, or phenyl.

[Chemical Formula 4-6]

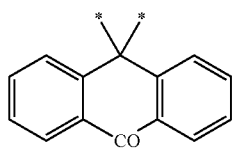

[Chemical Formula 4-7]

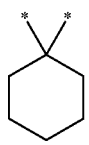

[Chemical Formula 4-8]

[Chemical Formula 4-9]

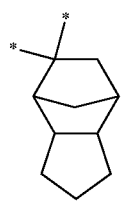

[Chemical Formula 4-10]

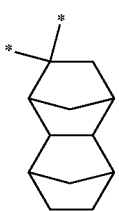

[Chemical Formula 4-11]

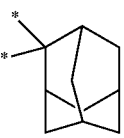

In Chemical Formulae 1 and 2, $Y^1$ and $Y^2$ are the same or different and are independently hydroxy, a substituted or unsubstituted (meth)acrylate group, an organic group including a carboxyl group, and the like.

The organic group including a carboxyl group may include a substituent represented by the following Chemical Formula 5.

[Chemical Formula 5]

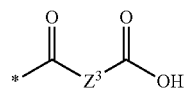

In Chemical Formula 5, $Z^3$ is a linking group represented by following Chemical Formulae 6-1 to 6-7.

[Chemical Formula 6-1]

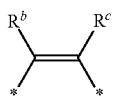

In Chemical Formula 6-1, $R^b$ and $R^c$ are the same or different and are independently hydrogen, substituted or unsubstituted C1 to C20 alkyl, ester, or ether.

[Chemical Formula 6-2]

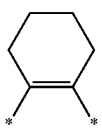

[Chemical Formula 6-3]

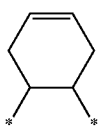

[Chemical Formula 6-4]

[Chemical Formula 6-5]

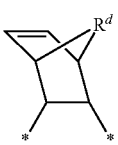

In Chemical Formula 6-5, $R^d$ is O, S, NH, substituted or unsubstituted C1 to C20 alkyl, C1 to C20 an alkylamine, or C2 to C20 alkylamine.

[Chemical Formula 6-6]

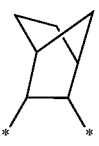

[Chemical Formula 6-7]

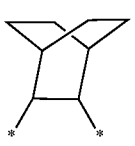

In Chemical Formulae 1 and 2, $X^{11}$ and $X^{12}$ are the same or different and are independently a linking group represented by the following Chemical Formula 7.

[Chemical Formula 7]

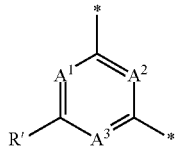

In Chemical Formula 7, $A^1$, $A^2$ and $A^3$ are the same or different and are independently carbon or nitrogen, and R' is hydrogen, halogen, hydroxy, substituted or unsubstituted C1 to C20 alkyl, amine, C1 to C20 alkylamine, C2 to C20 alkylamine, and the like.

The cardo-based monomer may have excellent compatibility when it is included in photosensitive resin composition and may provide improved developability, sensitivity, close contacting properties and mechanical strength by including a linking group represented by the above Chemical Formula 5 at positions $X^{11}$ and $X^{12}$ in Chemical Formulae 1 and 2. Also the cardo-based monomer may provide excellent heat resistance and light resistance, so that the photosensitive resin composition can be used at a high temperature.

In Chemical Formulae 1 and 2, $m^1$, $m^2$, $m^{11}$ and $m^{12}$ are the same or different and are independently an integer of 0 to 4, and $n^{11}$ and $n^{12}$ are the same or different and are independently an integer of 1 to 10.

The cardo-based monomer (A) may include monomers represented by the following Chemical Formulae 8-1 to 8-6, and combinations thereof, but is not limited thereto. Since the cardo-based monomer includes at least two or more (meth) acrylate groups as shown in the following Chemical Formulae 8-1 to 8-6, it may show high sensitivity during exposure.

[Chemical Formula 8-1]

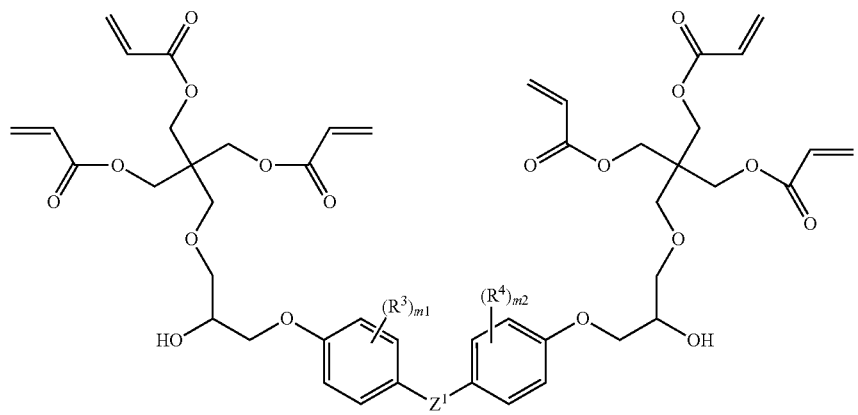

[Chemical Formula 8-2]

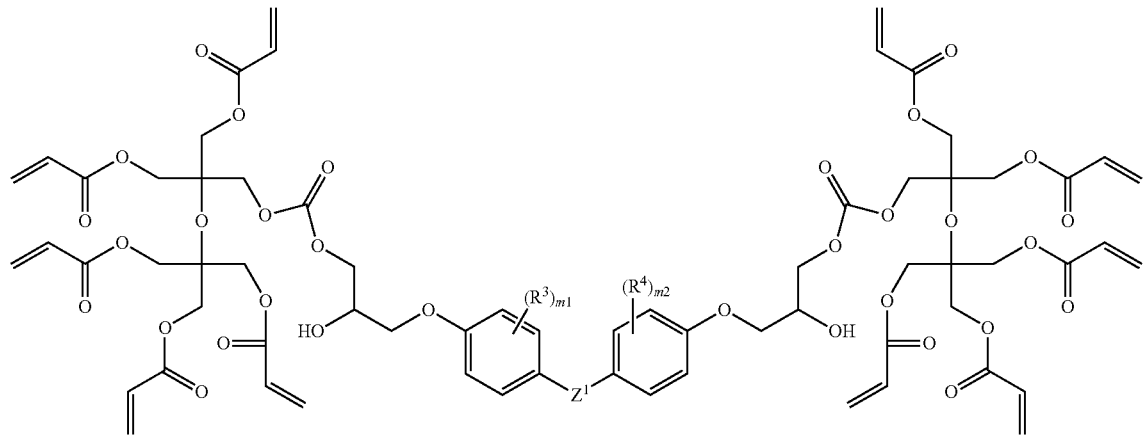

[Chemical Formula 8-3]

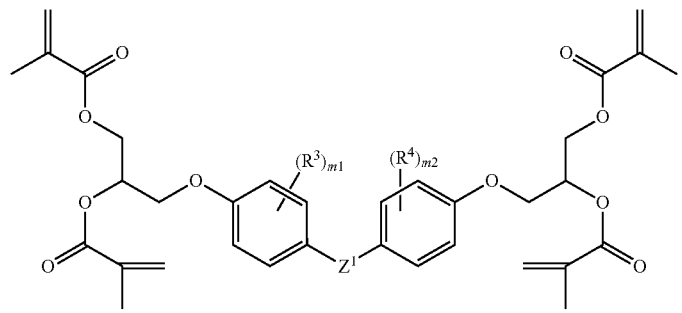

[Chemical Formula 8-4]
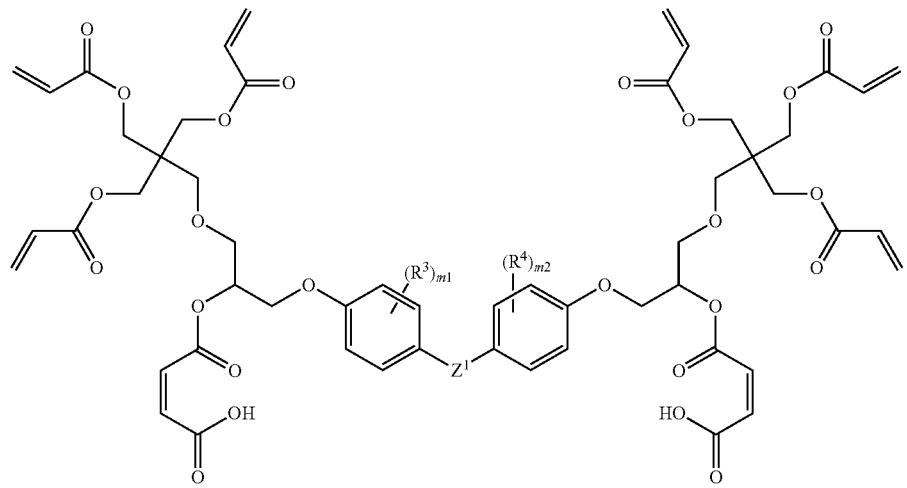
[Chemical Formula 8-5]
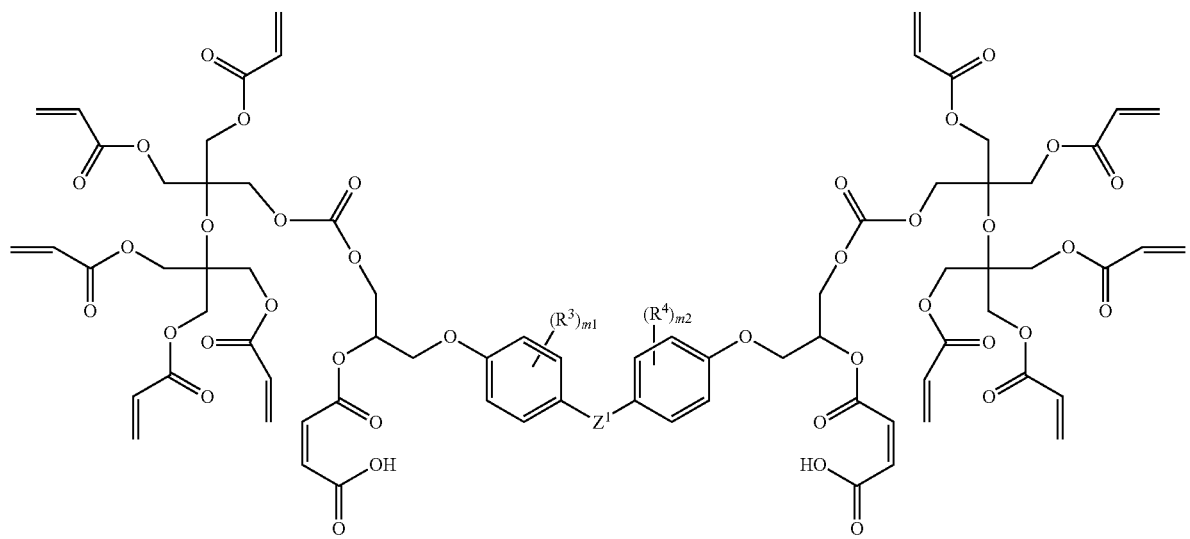
[Chemical Formula 8-6]
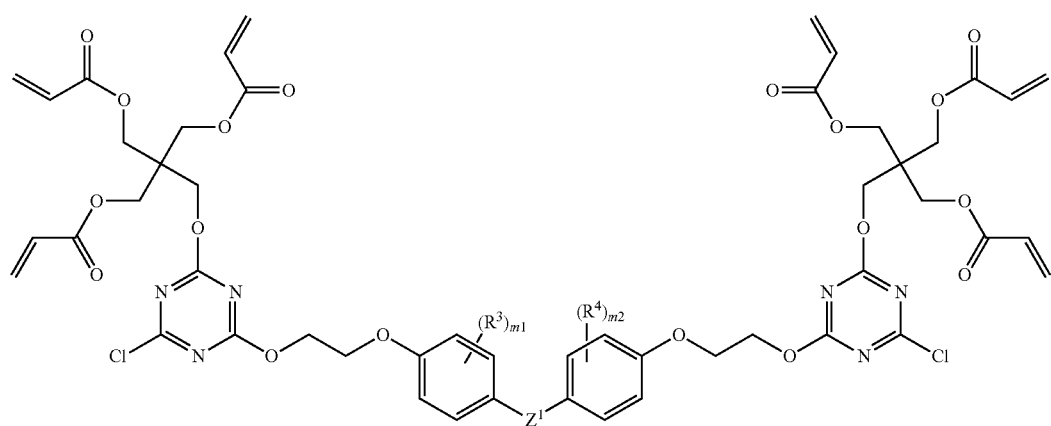

In Chemical Formulae 8-1 to 8-6, $R^3$ and $R^4$ are the same or different and are independently hydrogen, halogen, substituted or unsubstituted C1 to C20 alkyl, and the like.

$Z^1$ is a single bond, O, CO, $SO_2$, $CR^6R^7$, $SiR^8R^9$ (wherein $R^6$ to $R^9$ are the same or different and are independently hydrogen or substituted or unsubstituted C1 to C20 alkyl), or a linking group represented by Chemical Formula 4-1 to 4-11 as defined herein.

$m^1$ and $m^2$ are the same or different and are independently integers ranging from 0 to 4.

The cardo-based monomers (A) can be produced by reacting suitable starting materials to provide a compound of Chemical Formula 1 and/or 2. Suitable starting materials are commercially available and/or can be readily synthesized by the skilled artisan. The examples below illustrate non-limiting exemplary starting materials and reaction conditions suitable for making the cardo-based monomers (A). The skilled artisan will understand and appreciate how to make the cardo-based monomers (A), including the selection of suitable starting materials and reaction conditions, without undue experimentation.

The photosensitive resin composition may include the cardo-based monomer A in an amount of about 1 to about 30 wt %, for example about 1 to about 20 wt %, based on the total amount of the photosensitive resin composition.

In some embodiments, the photosensitive resin composition may include the cardo-based monomer A in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 wt %. Further, according to some embodiments of the present invention, the amount of the cardo-based monomer A can be in a range from about any of the foregoing amounts to about any other of the foregoing amounts.

When the photosensitive resin composition includes the cardo-based monomer in an amount in the above range, excellent sensitivity, heat resistance, light resistance, and close contacting properties may be obtained.

(B) Cardo-Based Resin

The cardo-based resin may be a polymer including a repeating unit represented by the following Chemical Formula 9. When used together with the aforementioned cardo-based monomer (A), compatibility may be so excellent that the developability, sensitivity, close contacting property and mechanical strength may be improved. Further, the heat resistance and light resistance may also be superb, so that it can be possible to easily use the composition at a high temperature.

$Z^{20}$ is a single bond, O, CO, $SO_2$, $CR^{25}R^{26}$, $SiR^{27}R^{28}$ (wherein $R^{25}$ to $R^{28}$ are the same or different and are independently hydrogen or substituted or unsubstituted C1 to C20 alkyl), or a linking group represented by the following Chemical Formula 10-1 to 10-11, and $Z^{21}$ is an acid anhydride residual group or an acid dianhydride residual group.

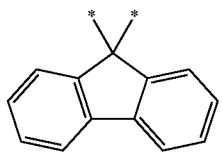

[Chemical Formula 10-1]

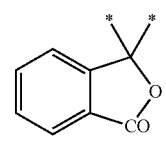

[Chemical Formula 10-2]

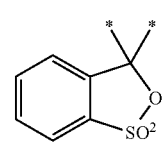

[Chemical Formula 10-3]

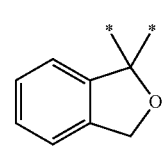

[Chemical Formula 10-4]

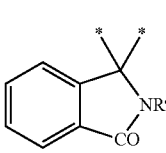

[Chemical Formula 10-5]

In Chemical Formula 10-5, $R^a$ is hydrogen, ethyl group, $C_2H_4Cl$, $C_2H_4OH$, $CH_2CH=CH_2$, or phenyl.

[Chemical Formula 9]

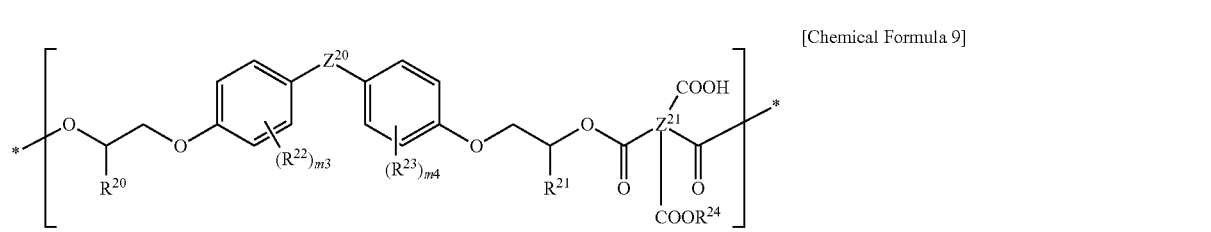

In Chemical Formula 9, $R^{20}$ and $R^{21}$ are the same or different and are independently hydrogen or substituted or unsubstituted (meth)acrylate, $R^{22}$ and $R^{23}$ are the same or different and are independently hydrogen, halogen, or substituted or unsubstituted C1 to C20 alkyl, $R^{24}$ is hydrogen, substituted or unsubstituted C1 to C20 alkyl, or substituted or unsubstituted (meth)acrylate,

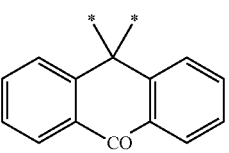

[Chemical Formula 10-6]

-continued

[Chemical Formula 10-7]

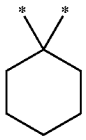

[Chemical Formula 10-8]

[Chemical Formula 10-9]

[Chemical Formula 10-10]

[Chemical Formula 10-11]

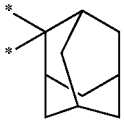

According to one embodiment, the cardo-based resin may be obtained from the reaction between the cardo-based compound represented by the following Chemical Formula 11 and tetracarboxylic dianhydride.

[Chemical Formula 11]

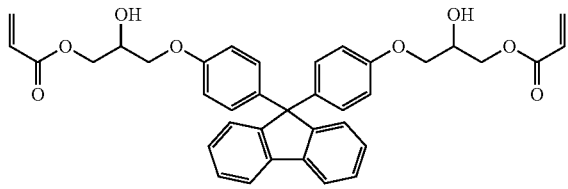

The tetracarboxylic dianhydride may be an aromatic tetracarboxylic dianhydride.

Examples of the aromatic tetracarboxylic dianhydride may include without limitation pyromellic dianhydride, 3,3',4,4'-biphenyltetracarboxylic acid dianhydride, 2,3,3',4-biphenyltetracarboxylic acid dianhydride, 2,2',3,3'-biphenyltetracarboxylic acid dianhydride, 3,3',4,4'-benzophenonetetracarboxylic acid dianhydride, 3,3',4,4'-biphenylethertetracarboxylic acid dianhydride, 3,3',4,4'-diphenylsulfonetetracarboxylic acid dianhydride, 1,2,3,4-cyclopentanetetracarboxylic acid dianhydride, 1,2,5,6-naphthalenetetracarboxylic acid dianhydride, 2,3,6,7-naphthalenetetracarboxylic acid dianhydride, 1,4,5,8-naphthalenetetracarboxylic acid dianhydride, 2,3,5,6-pyridinetetracarboxylic acid dianhydride, 3,4,9,10-perylenetetracarboxylic acid dianhydride, 2,2-bis (3,4-dicarboxylphenyl)hexafluoropropane dianhydride, and the like, and combinations thereof.

Non-limiting examples of the cardo-based resin may include two or more of a fluorene-containing compound such as 9,9-bis (4-oxiranylmethoxyphenyl)fluorene, and the like; an anhydride compound such as benzenetetracarboxylic dianhydride, naphthalenetetracarboxylic dianhydride, biphenyltetracarboxylic dianhydride, benzophenonetetracarboxylic dianhydride, pyromellitic dianhydride, cyclobutanetetracarboxylic dianhydride, perylenetetracarboxylic dianhydride, tetrahydrofurantetracarboxylic dianhydride, tetrahydrophthacid anhydride, and the like; a glycol compound such as ethylene glycol, propylene glycol, polyethylene glycol, and the like; an alcohol compound such as methanol, ethanol, propanol, n-butanol, cyclohexanol, benzylalcohol, and the like; a solvent-based compound such as propylene glycol methyl ether acetate, N-methylpyrrolidone, and the like; a phosphorus compound such as triphenylphosphine, and the like; and an amine or ammonium salt compound tetramethylammonium chloride, tetraethylammonium bromide, benzyldiethylamine, triethylamine, tributylamine, benzyltriethylammonium chloride, and the like.

The cardo-based resin may have a weight average molecular weight of about 500 to about 50,000 g/mol, for example about 1,000 to about 30,000 g/mol. When the cardo-based resin has a weight average molecular weight within the above range, during manufacture of a light blocking layer, a pattern can be formed with minimal or no residue, and there may be minimal or no loss of film thickness during development, which can result in a good pattern.

The photosensitive resin composition may include the cardo-based resin may in an amount of about 1 to about 30 wt %, for example about 3 to about 20 wt %, based on the total weight of the photosensitive resin composition. In some embodiments, the photosensitive resin composition may include the cardo-based resin in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 wt %. Further, according to some embodiments of the present invention, the amount of the cardo-based resin can be in a range from about any of the foregoing amounts to about any other of the foregoing amounts.

When the cardo-based resin is included in an amount within the above range, excellent sensitivity, developability, and close contacting properties may be realized.

The photosensitive resin composition may further include an acrylic-based resin in addition to the cardo-based resin.

The acrylic-based resin can be a copolymer of a first ethylenic unsaturated monomer and a second ethylenic unsaturated monomer that is copolymerizable with the first ethylenic unsaturated monomer, and a resin including at least one acrylic-based repeating unit.

The first ethylenic unsaturated monomer is an ethylenic unsaturated monomer including at least one carboxyl group. Examples of the monomer include without limitation acrylic acid, (meth)acrylic acid, maleic acid, itaconic acid, fumaric acid, and the like, and combinations thereof.

The copolymer may include the first ethylenic unsaturated monomer may be included in an amount ranging from about 5 to about 50 wt %, for example, from about 10 to about 40 wt % based on the total amount of the acrylic-based resin. In some embodiments, the copolymer may include the first ethylenic unsaturated monomer in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the first ethylenic unsaturated monomer can be in a range from about any of the foregoing amounts to about any other of the foregoing amounts.

Examples of the second ethylenic unsaturated monomer may include without limitation aromatic vinyl compounds such as styrene, α-methylstyrene, vinyltoluene, vinylbenzylmethylether, and the like; unsaturated carboxylic acid ester compounds such as methyl(meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, and the like; unsaturated carboxylic acid amino alkyl ester compounds such as 2-aminoethyl(meth)acrylate, 2-dimethylaminoethyl (meth)acrylate, and the like; carboxylic acid vinyl ester compounds such as vinyl acetate, vinyl benzoate, and the like; unsaturated carboxylic acid glycidyl ester compounds such as glycidyl(meth)acrylate and the like; vinyl cyanide compounds such as (meth)acrylonitrile and the like; unsaturated amide compounds such as (meth)acrylamide and the like; and the like. They may be used singularly or as a mixture of two or more.

Examples of the acrylic-based resin may include without limitation a methacrylic acid/benzylmethacrylate copolymer, a methacrylic acid/benzylmethacrylate/styrene copolymer, a methacrylic acid/benzylmethacrylate/2-hydroxyethylmethacrylate copolymer, a methacrylic acid/benzylmethacrylate/styrene/2-hydroxyethylmethacrylate copolymer, and the like. They may be used singularly or as a mixture of two or more.

The acrylic-based resin may have a weight average molecular weight ranging from about 3,000 to about 150,000 g/mol, for example about 3,000 to about 40,000 g/mol, and as another example about 5,000 to about 30,000 g/mol. When the acrylic-based resin has a weight average molecular weight within the above range, the photosensitive resin composition can have good physical and chemical properties, appropriate viscosity, and close contacting properties with a substrate when used as a light blocking layer.

The acrylic-based resin may have an acid value ranging from about 20 to about 200 mgKOH/g, for example about 50 to about 150 mgKOH/g. When the acrylic-based resin has an acid value within the above range, excellent pixel resolution may be realized.

When the photosensitive resin composition includes the acrylic-based resin, the cardo-based resin and the acrylic-based resin may be present at a weight ratio of about 99:1 to about 1:99, for example about 99:1 to about 30:70.

In some embodiments, the mixture of the cardo-based resin and acrylic-based resin may include the cardo-based resin in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, or 99 wt %. Further, according to some embodiments of the present invention, the amount of the cardo-based resin in the mixture of the cardo-based resin and acrylic-based resin can be in a range from about any of the foregoing amounts to about any other of the foregoing amounts.

In some embodiments, the mixture of the cardo-based resin and acrylic-based resin may include the acrylic-based resin in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, or 99 wt %. Further, according to some embodiments of the present invention, the amount of the acrylic-based resin in the mixture of the cardo-based resin and acrylic-based resin can be in a range from about any of the foregoing amounts to about any other of the foregoing amounts.

When the cardo-based resin and acrylic-based resin are included in an amount at the above weight ratio, excellent development properties and sensitivity may be realized and a light blocking layer pattern having excellent pattern-forming abilities may be obtained while inhibiting undercut generation.

(C) Reactive Unsaturated Compound

The reactive unsaturated compound may be any generally-used monomer or oligomer in a photosensitive resin composition. In exemplary embodiments, the reactive unsaturated compound may be a mono-functional or multi-functional ester of (meth)acrylic acid including at least one ethylenic unsaturated double bond.

The reactive unsaturated compound can promote sufficient polymerization when the composition is exposed during pattern forming processes to form patterns having excellent heat resistance, light resistance, and chemical resistance, due to the ethylenic unsaturated double bond.

Examples of the reactive unsaturated compound may include without limitation ethylene glycol diacrylate, ethylene glycol dimethacrylate, diethylene glycol diacrylate, triethylene glycol diacrylate, triethylene glycol dimethacrylate, 1,6-hexanediol diacrylate, 1,6-hexanediol dimethacrylate, pentaerythritol triacrylate, pentaerythritol tetraacrylate, dipentaerythritol pentaacrylate, dipentaerythritol hexaacrylate, bisphenolA epoxyacrylate, ethyleneglycolmonomethylether acrylate, trimethylolpropane triacrylate, trisacryloyloxyethyl phosphate, and the like, and combinations thereof.

Commercially available examples of the reactive unsaturated compound are as follows. The mono-functional (meth)acrylic acid ester may include without limitation Aronix M-101®, M-111®, M-114® (TOAGOSEI CHEMICAL INDUSTRY CO., LTD.); KAYARAD TC-110S®, TC-120S® (NIPPON KAYAKU CO., LTD.); V-158®, V-2311® (OSAKA ORGANIC CHEMICAL IND., LTD.), and the like. Examples of a difunctional (meth)acrylic acid ester may include without limitation Aronix M-210®, M-240®, M-6200® (TOAGOSEI CHEMICAL INDUSTRY CO., LTD.), KAYARAD HDDA®, HX-220®, R-604® (NIPPON KAYAKU CO., LTD.), V-260®, V-312®, V-335 HP® (OSAKA ORGANIC CHEMICAL IND., LTD.), and the like. Examples of a tri-functional (meth)acrylic acid ester may include without limitation Aronix M-309®, M-400®, M-405®, M-450®, M-7100®, M-8030®, M-8060® (TOAGOSEI CHEMICAL INDUSTRY CO., LTD.), KAYARAD TMPTA®, DPCA-20®, DPCA-30®, DPCA-60®, DPCA-120® (NIPPON KAYAKU CO., LTD.), V-295®, V-300®, V-360®, V-GPT®, V-3PA®, V-400® (Osaka Yuki Kayaku Kogyo Co. Ltd.), and the like. The reactive unsaturated compounds may be used singularly or as a mixture of two or more.

The reactive unsaturated compound may be treated with acid anhydride to improve developability.

The photosensitive resin composition may include the reactive unsaturated compound in an amount ranging from about 1 to about 30 wt %, for example about 1 to about 20 wt %, based on the total amount of the photosensitive resin composition. In some embodiments, the photosensitive resin composition may include the reactive unsaturated compound in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 wt %. Further, according to some embodiments of the present invention, the amount of the reactive unsaturated compound can be in a range from about any of the foregoing amounts to about any other of the foregoing amounts.

When the reactive unsaturated compound is included in an amount within the above range, the composition may be sufficiently cured when exposed during pattern forming processes, and reliability, heat resistance, light resistance, and chemical resistance, resolution and close contacting properties of pattern may be realized.

(D) Pigment

The pigment may be an organic pigment, an inorganic pigment, or a combination thereof.

The pigment may include a red pigment, a green pigment, a blue pigment, a yellow pigment, a black pigment, and the like, and combinations thereof.

Examples of the red pigment include without limitation C.I. red pigment 254, C.I. red pigment 255, C.I. red pigment 264, C.I. red pigment 270, C.I. red pigment 272, C.I. red pigment 177, C.I. red pigment 89, and the like. Examples of the green pigment include without limitation a halogen-substituted copper phthalocyanine pigment such as C.I. green pigment 36, C.I. green pigment 7, and the like. Examples of the blue pigment include without limitation a copper phthalocyanine pigment such as C.I. blue pigment 15:6, C.I. blue pigment 15, C.I. blue pigment 15:1, C.I. blue pigment 15:2, C.I. blue pigment 15:3, C.I. blue pigment 15:4, C.I. blue pigment 15:5, C.I. blue pigment 16, and the like. Examples of the yellow pigment include without limitation an isoindoline pigment such as C.I. yellow pigment 139, and the like, a quinophthalone pigment such as C.I. yellow pigment 138, and the like, a nickel complex pigment such as C.I. yellow pigment 150, and the like. Examples of the black pigment include without limitation aniline black, perylene black, titanium black, carbon black, and the like. The pigments may be used singularly or as a mixture of two or more and are not limited to the above described pigments.

Among them, in order to implement light blocking of a light blocking layer efficiently, the black pigment may be included. When the black pigment is used, a color calibrating agent may be also used. Examples of color calibrating agents include without limitation anthraquinone-based pigments, perylene-based pigments, phthalocyanine-based pigments, azo-based pigments, and the like, and combinations thereof.

The photosensitive resin composition may further include a dispersing agent in order to improve dispersion of the pigment.

For example, the pigment may be surface-pretreated with a dispersing agent, or the pigment and dispersing agent may be added together during preparation of the photosensitive resin composition.

The dispersing agent may include a non-ionic dispersing agent, an anionic dispersing agent, a cationic dispersing agent, and the like. Examples of the dispersing agent include without limitation polyalkylene glycol and esters thereof, polyoxyalkylene, a polyhydric alcohol ester alkylene oxide addition product, an alcohol alkylene oxide addition product, sulfonic acid ester, sulfonate, carboxylic acid ester, carboxylate salts, an alkylamide alkylene oxide addition product, alkyl amine, and the like. The dispersing agents may be used singularly or as a mixture of two or more.

Commercially available examples of the dispersing agent include without limitation: DISPERBYK-101, DISPERBYK-130, DISPERBYK-140, DISPERBYK-160, DISPERBYK-161, DISPERBYK-162, DISPERBYK-163, DISPERBYK-164, DISPERBYK-165, DISPERBYK-166, DISPERBYK-170, DISPERBYK-171, DISPERBYK-182, DISPERBYK-2000, DISPERBYK-2001, and the like (BYK); EFKA-47, EFKA-47EA, EFKA-48, EFKA-49, EFKA-100, EFKA-400, EFKA-450, and the like (EFKA chemicals); Solsperse 5000, Solsperse 12000, Solsperse 13240, Solsperse 13940, Solsperse 17000, Solsperse 20000, Solsperse 24000GR, Solsperse 27000, Solsperse 28000, and the like (Zeneka); or PB711, PB821, and the like (Ajinomoto), and combinations thereof.

The photosensitive resin composition may include the dispersing agent in an amount of about 0.1 to about 15 wt %, based on the total amount of the photosensitive resin composition. When the dispersing agent is included in an amount in the above range, dispersion of the photosensitive resin composition can be improved, which can result in excellent stability, developability, and patterning properties during manufacture of a light blocking layer.

The pigment may be selectively pretreated with water-soluble inorganic salts and a wetting agent. When the pigment is pretreated, it can have a finer primary particle size.

This pretreatment process includes kneading a pigment with a water-soluble inorganic salt and a wetting agent and filtering and washing the obtained pigment.

The kneading may be performed at a temperature of about 40 to about 100° C. The filtering and washing process can be performed by washing the inorganic salt using water and the like.

Examples of the water-soluble inorganic salt include without limitation sodium chloride, potassium chloride, or the like, and combinations thereof. The wetting agent allows the pigment to be uniformly mixed with the inorganic salts and be pulverized. Examples of the wetting agent include without limitation alkylene glycol monoalkyl ethers such as ethylene glycol monoethylether, propylene glycol monomethylether, diethylene glycol monomethylether, and the like; alcohols such as ethanol, isopropanol, butanol, hexanol, cyclohexanol, ethyleneglycol, diethyleneglycol, polyethyleneglycol, glycerine polyethyleneglycol, and the like. These may be used singularly or as a mixture of two or more.

The kneaded pigment can have an average particle diameter ranging from about 30 to about 100 nm. When the pigment has an average particle diameter within the above range, a fine pattern may be effectively formed having excellent heat resistance and light resistance.

The photosensitive resin composition may include the pigment in an amount of about 1 to about 30 wt %, for example about 2 to about 20 wt %, based on the total amount of the photosensitive resin composition. In some embodiments, the photosensitive resin composition may include the pigment in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 wt %. Further, according to some embodiments of the present invention, the amount of the pigment can be in a range from about any of the foregoing amounts to about any other of the foregoing amounts.

When the pigment is included in an amount within the above range, color reproducibility, curing capability, and close contacting properties of a pattern may be excellent.

(E) Initiator

The initiator may include a photopolymerization initiator, a radical polymerization initiator, or a combination thereof.

The photopolymerization initiator may be any generally-used initiator in a photosensitive resin composition, for example an acetophenone-based compound, a benzophenone-based compound, a thioxanthone-based compound, a benzoin-based compound, a triazine-based compound, and the like, and combinations thereof.

Examples of the acetophenone-based compound include without limitation 2,2'-diethoxy acetophenone, 2,2'-dibutoxy acetophenone, 2-hydroxy-2-methylpropinophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like, and combinations thereof.

Examples of the benzophenone-based compound include without limitation benzophenone, benzoyl benzoate, benzoyl methyl benzoate, 4-phenyl benzophenone, hydroxy benzophenone, acrylated benzophenone, 4,4'-bis(dimethyl amino)benzophenone, 4,4'-bis(diethylamino)benzophenone, 4,4'-dimethylaminobenzophenone,4,4'-dichlorobenzophenone, 3,3'-dimethyl-2-methoxybenzophenone, and the like, and combinations thereof.

Examples of the thioxanthone-based compound include without limitation thioxanthone, 2-methylthioxanthone, isopropyl thioxanthone, 2,4-diethyl thioxanthone, 2,4-diisopropyl thioxanthone, 2-chlorothioxanthone, and the like, and combinations thereof.

Examples of the benzoin-based compound include without limitation benzoin, benzoin methyl ether, benzoin ethyl ether, benzoin isopropyl ether, benzoin isobutyl ether, benzyldimethylketal, and the like, and combinations thereof.

Examples of the triazine-based compound include without limitation 2,4,6-trichloro-s-triazine, 2-phenyl 4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl 4,6-bis(trichloro methyl)-s-triazine, bis(trichloromethyl)-6-styryl-s-triazine, 2-(napho-1-yl)-4,6-bis(trichloromethyl)-s-triazine, 2-(4-methoxynaphto-1-yl)-4,6-bis(trichloromethyl)-s-triazine, 2-4-tri chloromethyl(piperonyl)-6-triazine, 2-4-trichloromethyl (4'-methoxystyryl)-6-triazine, and the like, and combinations thereof.

The photopolymerization initiator may further include a carbazole-based compound, a diketone-based compound, a sulfonium borate-based compound, a diazo-based compound, a biimidazole-based compound, and the like, and combinations thereof.

Examples of the radical polymerization initiator may include without limitation peroxide-based compounds, azobis-based compounds, and the like, and combinations thereof.

Examples of the peroxide-based compound include without limitation ketone peroxides such as methylethylketone peroxide, methylisobutylketone peroxide, cyclohexanone peroxide, methylcyclohexanone peroxide, acetylacetone peroxide, and the like; diacyl peroxides such as isobutyryl peroxide, 2,4-dichlorobenzoyl peroxide, o-methylbenzoyl peroxide, bis-3,5,5-trimethylhexanoyl peroxide, and the like; hydro peroxides such as 2,4,4,-trimethylpentyl-2-hydro peroxide, diisopropylbenzenehydro peroxide, cumenehydro peroxide, t-butylhydro peroxide, and the like; dialkyl peroxides such as dicumyl peroxide, 2,5-dimethyl-2,5-di(t-butylperoxy)hexane, 1,3-bis(t-butyloxyisopropyl)benzene, t-butylperoxyvaleric acid n-butylester, and the like; alkyl peresters such as 2,4,4-trimethylpentyl peroxyphenoxyacetate, α-cumyl peroxyneodecanoate, t-butyl peroxybenzoate, di-t-butyl peroxytrimethyladipate, and the like; percarbonates such as di-3-methoxybutyl peroxydicarbonate, di-2-ethylhexyl peroxydicarbonate, bis-4-t-butylcyclohexyl peroxydicarbonate, diisopropyl peroxydicarbonate, acetylcyclohexylsulfonyl peroxide, t-butyl peroxyarylcarbonate, and the like, and combinations thereof.

Examples of the azobis-based compound include without limitation 1,1'-azobiscyclohexane-1-carbonitrile, 2,2'-azobis(2,4-dimethylvaleronitrile), 2,2,-azobis(methylisobutyrate), 2,2'-azobis(4-methoxy-2,4-dimethylvaleronitrile), α,α'-azobis(isobutylnitrile) and 4,4'-azobis(4-cyanovaleric acid), and the like, and combinations thereof.

Since the initiator absorbs light and is excited and then transmits energy, it may be used with a photo-sensitizer causing a chemical reaction.

Examples of the photo-sensitizer include without limitation tetraethylene glycol bis-3-mercapto propionate, pentaerythritol tetrakis-3-mercapto propionate, dipentaerythritol tetrakis-3-mercapto propionate, and the like, and combinations thereof.

The photosensitive resin composition may include the initiator in an amount of about 0.01 wt % to about 10 wt %, for example about 0.1 to about 5 wt %, based on the total amount of the photosensitive resin composition. In some embodiments, the photosensitive resin composition may include the initiator in an amount of about 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, 1, 2, 3, 4, 5, 6, 7, 8, 9, or 10 wt %. Further, according to some embodiments of the present invention, the amount of the initiator can be in a range from about any of the foregoing amounts to about any other of the foregoing amounts.

When the initiator is included in an amount within the above range, the composition can be sufficiently cured when exposed during a pattern forming process to obtain excellent reliability, heat resistance, light resistance, and chemical resistance, resolution and close contacting properties with minimal or no deterioration of transmittance due to non-reacting initiators.

(F) Solvent

The solvent is compatible with the cardo-based monomer, the cardo-based resin, reactive unsaturated compound, pigment and initiator but does not react therewith.

Examples of the solvent may include without limitation alcohols such as methanol, ethanol, and the like; ethers such as dichloroethyl ether, n-butyl ether, diisoamyl ether, methylphenyl ether, tetrahydrofuran, and the like; glycol ethers such as ethylene glycol methylether, ethylene glycol ethylether, propylene glycol methylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbon such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl ester such as ethyl acetate, n-butyl acetate, isobutyl acetate, and the like; lactate alkyl esters such as methyl lactate, ethyl lactate, and the like; alkyl hydroxy acetate ester such as methyl hydroxyacetate, ethyl hydroxyacetate, butyl hydroxyacetate, and the like; alkoxyalkyl acetate esters such as methoxymethyl acetate, methoxyethyl acetate, methoxybutyl acetate, ethoxymethyl acetate, ethoxyethyl acetate, and the like; alkyl 3-hydroxypropionate ester such as methyl 3-hydroxypropionate, ethyl 3-hydroxypropionate, and the like; alkyl 3-alkoxypropionate esters such as methyl 3-methoxypropionate, ethyl 3-methoxypropionate, ethyl 3-ethoxypropionate, methyl 3-ethoxypropionate, and the like; alkyl 2-hydroxypropionate ester such as methyl 2-hydroxypropionate, ethyl 2-hydroxypropionate, propyl 2-hydroxypropionate, and the like; alkyl 2-alkoxypropionate ester such as methyl 2-methoxypropionate, ethyl 2-methoxypropionate, ethyl 2-ethoxypropionate, methyl 2-ethoxypropionate, and the like; alkyl 2-hydroxy-2-methylpropionate esters such as methyl 2-hydroxy-2-methylpropionate, ethyl 2-hydroxy-2-methylpropionate, and the like; alkyl 2-alkoxy-2-methylpropionate esters such as methyl 2-methoxy-2-methylpropionate, ethyl 2-ethoxy-2-methylpropionate, and the like; esters such as 2-hydroxyethyl propionate, 2-hydroxy-2-methylethyl propionate, hydroxyethyl acetate, methyl 2-hydroxy-3-methylbutanoate, and the like; or ketonate esters such as ethyl pyruvate, and the like. Additionally, the following solvents may be also used: N-methylformamide, N,N-dimethyl formamide, N-methylformanilide, N-methylacetamide, N,N-dimethyl acetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, phenyl cellosolve acetate, and the like. These solvents may be used singularly or as a mixture of two or more.

Considering miscibility and reactivity, glycol ethers such as ethylene glycol monoethylether, and the like; ethylene glycol alkylether acetates such as ethyl cellosolve acetate, and the like; esters such as 2-hydroxy ethyl propionate, and the like; diethylene glycols such as diethylene glycol monomethylether, and the like; propylene glycol alkylether acetates such as propylene glycol methylether acetate, propylene glycol propylether acetate, and the like, and combinations thereof may be used in exemplary embodiments.

The solvent can be used in a balance amount. In exemplary embodiments, the photosensitive resin composition may include the solvent in an amount of about 50 to about 90 wt %, based on the total amount of the photosensitive resin composition. In some embodiments, the photosensitive resin composition may include the solvent in an amount of about 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of the solvent can be in a range from about any of the foregoing amounts to about any other of the foregoing amounts. When the solvent is included in an amount within the above range, the photosensitive resin composition may have an appropriate viscosity which can improve processability of a light blocking layer.

(G) Other Additive(s)

The photosensitive resin composition may further include an epoxy compound in order to improve close contacting properties with a substrate.

Examples of the epoxy compound include without limitation phenol novolac epoxy compounds, tetramethyl biphenyl epoxy compounds, bisphenol A epoxy compounds, alicyclic epoxy compounds, and the like, and combinations thereof.

The photosensitive resin composition may include the epoxy compound in an amount of about 0.01 to about 20 parts by weight, for example about 0.1 to about 10 parts by weight, based on about 100 parts by weight of the photosensitive resin composition. When the epoxy compound is included in an amount within the above range, close contacting properties, storage properties, and the like may be improved.

The photosensitive resin composition may further include a silane coupling agent having a reactive substituent such as a carboxyl group, a methacryloyl group, an isocyanate group, an epoxy group, and the like in order to improve adherence to a substrate.

Examples of the silane coupling agent include without limitation trimethoxysilyl benzoic acid, γ-methacryl oxypropyl trimethoxysilane, vinyl triacetoxysilane, vinyl trimethoxysilane, γ-isocyanate propyl triethoxysilane, γ-glycidoxy propyl trimethoxysilane, β-(3,4-epoxycyclohexyl) ethyltrimethoxysilane, and the like. They may be used singularly or as a mixture of two or more.

The photosensitive resin composition may include the silane coupling agent in an amount of about 0.01 to about 10 parts by weight, based on about 100 parts by weight of the photosensitive resin composition. When the silane coupling agent is included in an amount within the above range, close contacting properties, storage properties, and the like may be improved.

The photosensitive resin composition may further include a surfactant in order to improve coating properties and inhibit generation of spots.

Examples of the surfactant may include without limitation a fluorene-based surfactant, for example, BM-1000®, and BM-1100® (BM Chemie Inc.); MEGAFACE F 142D®, F 172®, F 173®, and F 183® DAINIPPON INK KAGAKU KOGYO CO., LTD.); FULORAD FC-135®, FULORAD FC-170C®, FULORAD FC-430®, and FULORAD FC-431® (SUMITOMO 3M CO., LTD.); SURFLON S-112®, SURFLON S-113®, SURFLON S-131®, SURFLON S-141®, and SURFLON S-145® (ASAHI GLASS CO., LTD.); and SH-28PA®, SH-190®, SH-193®, SZ-6032®, and SF-8428®, and the like (TORAY SILICONE CO., LTD.), and combinations thereof.

The photosensitive resin composition may include the surfactant in an amount of about 0.001 to about 5 parts by weight, based on about 100 parts by weight of the photosensitive resin composition. When the surfactant is included in an amount within the above range, the coating may be uniform, stains may not be generated, and wetting properties for a glass substrate can be improved.

The photosensitive resin composition may further one or more other additives such as but not limited to an antioxidant, a stabilizer, and the like in a predetermined amount suitable to provide the desired properties.

According to another embodiment, a light blocking layer manufactured using the photosensitive resin composition is provided. The light blocking layer may be manufactured as follows.

(1) Application and Film Formation

The aforementioned photosensitive resin composition can be coated to a desired thickness, for example, a thickness ranging from about 0.5 to about 25 μm, on a substrate which has undergone a predetermined pretreatment, using a spin or slit coating method, a roll coating method, a screen-printing method, an applicator method, and the like. Then, the coated substrate can be heated at a temperature ranging from about 70 to about 110° C. for about 1 to about 10 minutes to remove solvent.

(2) Exposure

The resultant film can be exposed to radiation (irradiated by an active ray) of about 190 to about 500 nm after placing a mask thereon with a predetermined shape to form a desired pattern. The radiation can be performed using a light source such as a low pressure mercury lamp, a high pressure mercury lamp, an ultra high pressure mercury lamp, a metal halide lamp, an argon gas laser, and the like. An X ray, an electron beam, and the like may be also used.

The exposure step can use, for example, a light dose of about 500 mJ/cm² or less (with a 365 nm sensor) when a high pressure mercury lamp is used. However, the light dose may vary depending on the kinds of each component of the photosensitive resin composition, the combination ratio thereof, and dry film thickness.

(3) Development

After the exposure process, an alkali aqueous solution can be used to develop the exposed film by dissolving and removing an unnecessary part except the exposed part, forming an image pattern.

(4) Post-Treatment

The developed image pattern may be heated again or radiated by an active ray and the like for curing, in order to provide excellent quality in terms of heat resistance, photo resistance, close contacting properties, crack-resistance, chemical resistance, high strength, storage stability, and the like.

Therefore, the aforementioned photosensitive resin composition may provide excellent insulation and optical density required for a light blocking layer.

Hereinafter, the present invention is illustrated in more detail with reference to examples. However, these are exemplary embodiments of present invention and are not limiting.

Preparation Example 1-1

Preparation of Cardo-Based Monomer (1) A compound represented by the following Chemical Formula 12-1 is prepared by adding 29.8 g of pentaerythritol triacrylate (produced by Aldrich Company) and 35.43 g of propylglycolmethylethylacetate (produced by Daicel Chemical Company) into a reactor, heating the mixture up to 50° C., adding 6.8 g of sodium etoxide (produced by Aldrich Company) to the mixture, adding 9.3 g of epichlorohidrin (produced by Aldrich Company) for 30 minutes, heating the mixture up to 80° C., allowing it to stand still for 3 hours, and filtrating the mixture.

[Chemical Formula 12-1]

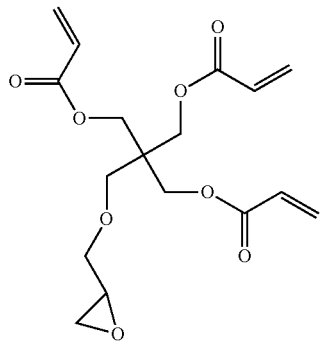

(2) A compound represented by the following Chemical Formula 12-2 is prepared by adding 35 g of 9,9'-bis(4-hydroxyphenyl)fluorene (produced by Hear Chem Company), 141.6 g of the compound represented by the above Chemical Formula 12-1, 0.23 g of benzyltriethylammonium chloride (Daejung Chemicals Company), 0.23 g of triphenylphosphine (produced by Aldrich Company), and 35 g of propylglycolmethylethylacetate (produced by Daicel Chemical Company) into the reactor, heating the mixture up to 90° C., and allowing it to stand still for 12 hours.

[Chemical Formula 12-2]

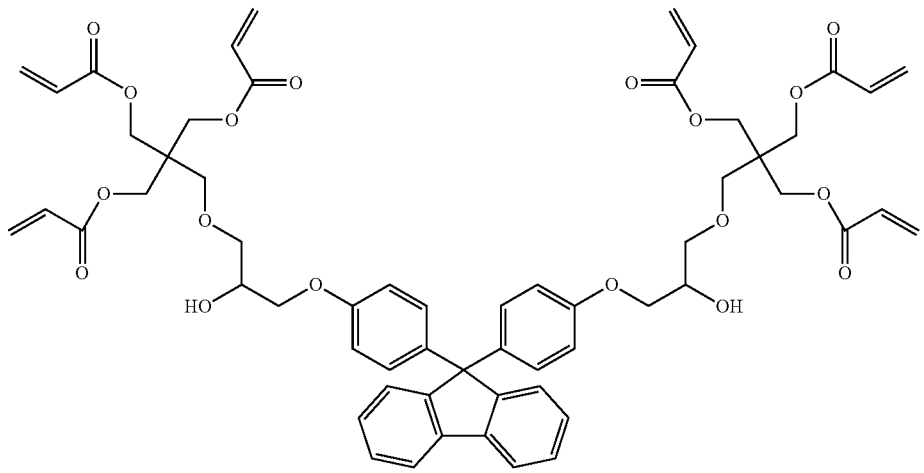

Preparation Example 1-2

Preparation of Cardo-Based Monomer

A compound represented by the following Chemical Formula 13-2 is prepared by adding 138 g of 9,9'-bis(4-hydroxyphenyl)fluorene (produced by Hear Chem Company), 355 g of the compound represented by the following Chemical Formula 13-1, 493 g of propylglycolmethylethylacetate (produced by Daicel Chemical Company), 1 g of triphenylphosphine (produced by Aldrich company), 1.4 g of benzyltriethylammonium chloride (produced by Daejung Chemicals Company), and 0.5 g of hydroquinone into a reactor, heating the mixture up to 120° C., and allowing it to stand still for 12 hours.

[Chemical Formula 13-1]

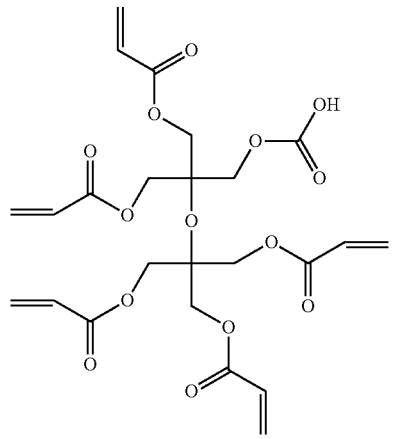

[Chemical Formula 13-2]

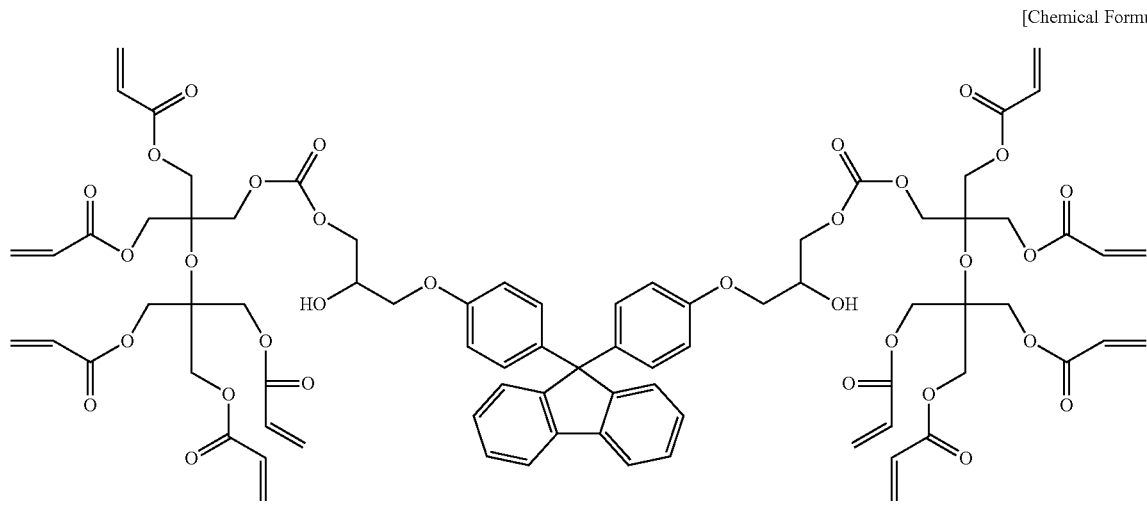

Preparation Example 1-3

Preparation of Cardo-Based Monomer (1) A compound represented by the following Chemical Formula 14-1 is prepared by adding 138 g of 9,9'-bis(4-hydroxyphenyl)fluorene (produced by Hear Chem. Company), 110 g of hydroxypotassium, and 700 g of water into a reactor, heating the mixture up to 100° C., allowing it to stand still for 12 hours, filtrating it to thereby obtain solids, rinsing the solids 5 times with water at room temperature for 30 minutes, and drying the rinsed solids.

[Chemical Formula 14-1]

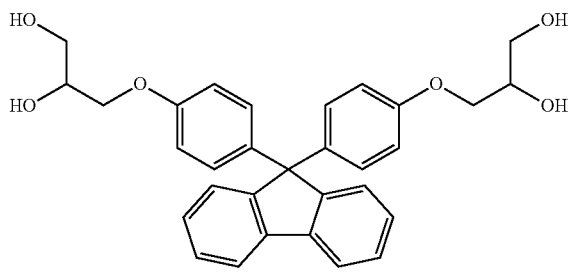

[Chemical Formula 14-2]

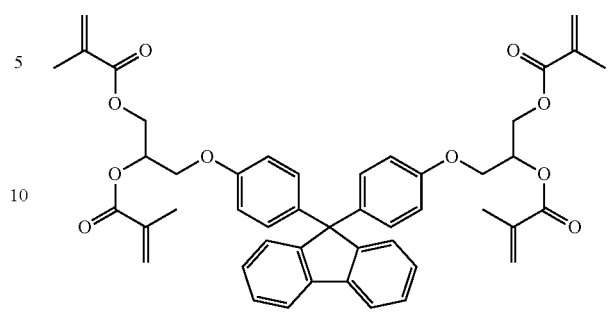

(2) A compound represented by the following Chemical Formula 14-2 is prepared by adding 100 g of compound represented by the above Chemical Formula 14-1, 70 g of pyridine (produced by Daejung Chemicals Company), and 465 g of propylglycolmethylethylacetate (produced by Daicel Chemical Company) into a reactor, cooling down the mixture to 5° C., adding 76 g of methacrylochloride (produced by Aldrich Company) for 2 hours, allowing it to stand still for 6 hours, and filtrating the mixture to thereby obtain solids.

Preparation Example 1-4

Preparation of Cardo-Based Monomer

A compound represented by the following Chemical Formula 15 is prepared by adding 100 g of a reaction solution including the compound prepared in Preparation Example 1-1 and represented by Chemical Formula 12-2 and 19 g of maleic unhydride into a reactor, heating the mixture up to 40° C., allowing it to stand still for 3 hours.

[Chemical Formula 15]

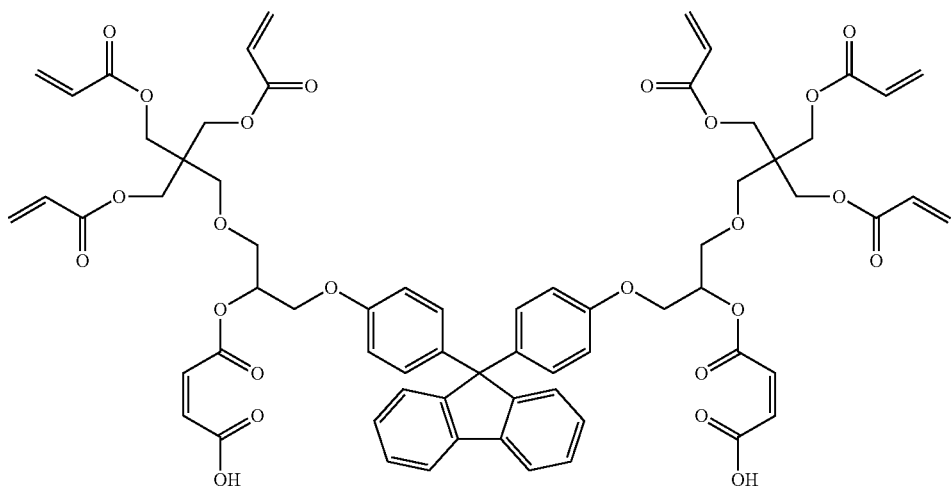

Preparation Example 1-5

Preparation of Cardo-Based Monomer

A compound represented by the following Chemical Formula 16 is prepared by adding 100 g of a reaction solution including the compound prepared in Preparation Example 1-2 and represented by Chemical Formula 13-2 and 13 g of maleic unhydride into a reactor, heating the mixture up to 40° C., and allowing it to stand still for 3 hours.

[Chemical Formula 16]

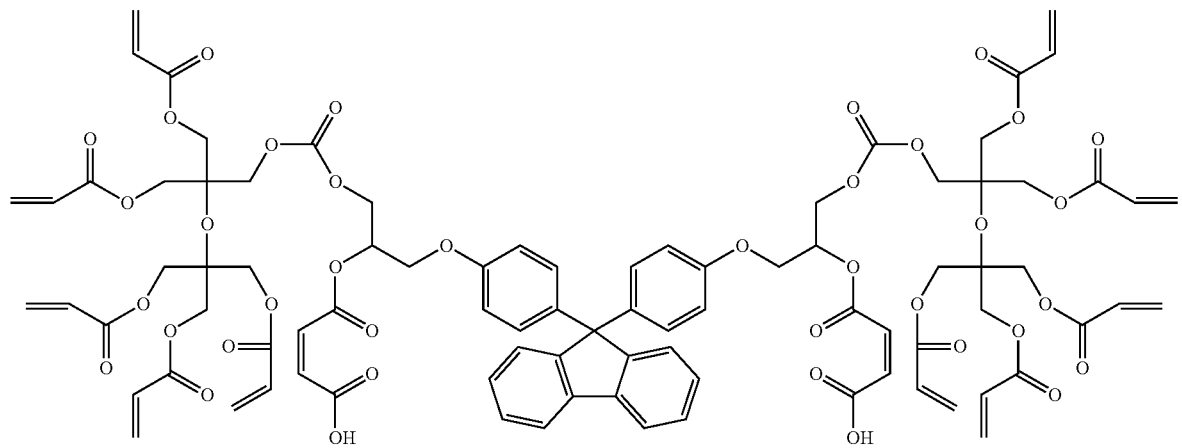

Preparation Example 1-6

Preparation of Cardo-Based Monomer 35 g of cyanuric chloride, 120 g of pentaerythritol triacrylate and 300 g of methylene chloride are adding into a reactor, and 30 g of pyridine is added thereto at 5° C. for one hour. The mixture is agitated for two hours while sustaining the temperature, and heated up to 40° C. Subsequently, 40 g of 9,9-bis[4-(2-hydroxyethoxy)phenyl]fluorene is added and agitated for two hours. A compound represented by the following Chemical Formula 17 is prepared by removing salts with a filter after the reaction ends, and distilling the reaction solution under reduced pressure.

benzylmethacrylate copolymer (produced by Miwon Commercial Co., Ltd, NPR8000), and 78 g of propyleneglycol methylethylacetate in a reactor, and dispersing the mixture with a paint-shaker (produced by Asada Company) for 12 hours.

Examples 1 to 6 and Comparative Example 1

Preparation of photosensitive resin composition

Photosensitive resin compositions according to Examples 1 to 6 and Comparative Example 1 are prepared using the types and amounts of components shown in the following Table 1.

[Chemical Formula 17]

Preparation Example 2

Preparation of Black Pigment Dispersion

A black pigment dispersion is prepared by mixing 15 g of carbon black (produced by Cabot Company), 4 g of DISPER-BYK-163 (produced by BYK company), 3 g of acrylic acid/ benzylmethacrylate copolymer (produced by Miwon Commercial Co., Ltd, NPR8000), and 78 g of propyleneglycol methylethylacetate in a reactor, and dispersing the mixture with a paint-shaker (produced by Asada Company) for 12 hours.

An initiator is dissolved in a solvent, and agitated at room temperature for two hours. Subsequently, a binder resin and a reactive unsaturated compound are added thereto and agitated at room temperature for two hours. Subsequently, the black pigment dispersion solution prepared in Preparation Example 2 and a silane coupling agent are added to the acquired reactant and then agitated at room temperature for one hour.

Subsequently, a photosensitive resin composition is prepared by filtrating the product three times to remove impurity.

(A) Cardo-Based Monomer (A-1) Compound represented by Chemical Formula 12-2 prepared in Preparation Example 1-1 is used.

(A-2) Compound represented by Chemical Formula 13-2 prepared in Preparation Example 1-2 is used.

(A-3) Compound represented by Chemical Formula 14-2 prepared in Preparation Example 1-3 is used.

(A-4) Compound represented by Chemical Formula 15-2 prepared in Preparation Example 1-4 is used.

(A-5) Compound represented by Chemical Formula 16 prepared in Preparation Example 1-5 is used.

(A-6 Compound represented by Chemical Formula 17 prepared in Preparation Example 1-6 is used.

(B) Cardo-Based Resin

V259ME produced by Nippon Steel Chemical Company is used.

(C) Reactive Unsaturated Compound

Dipentaerythritol hexaacrylate is used.

(D) Pigment Dispersion Solution

The black pigment dispersion solution prepared in Preparation Example 2 is used. Herein, pigment solids are included in an amount of 15 wt % based on the total amount of the black pigment dispersion solution.

(E) Initiator

IRGACURE OXE02 produced by Cib-Geigy Company is used.

(F) Solvent

Propylene glycol methylether acetate is used.

(G) Additive

As a silane coupling agent, γ-glycidoxy propyl trimethoxysilane (produced by Chisso Company, S-510) is used.

TABLE 1

|  |  | Example | | | | | | Comparative Example |
|---|---|---|---|---|---|---|---|---|
|  |  | 1 | 2 | 3 | 4 | 5 | 6 | 1 |
| (A) cardo-based monomer (wt %) | A-1 | 1.5 | — | — | — | — | — | — |
|  | A-2 | — | 1.5 | — | — | — | — | — |
|  | A-3 | — | — | 1.5 | — | — | — | — |
|  | A-4 | — | — | — | 1.5 | — | — | — |
|  | A-5 | — | — | — | — | 1.5 | — | — |
|  | A-6 | — | — | — | — | — | 1.5 | — |
| (B) cardo-based resin (wt %) | | 9.5 | 9.5 | 9.5 | 9.5 | 9.5 | 9.5 | 9.5 |
| (C) reactive unsaturated compound (wt %) | | 2 | 2 | 2 | 2 | 2 | 2 | 3.5 |
| (D) pigment dispersion (wt %) | | 406* | 406* | 406* | 406* | 406* | 406* | 406* |
| (E) initiator (wt %) | | 0.5 | 0.5 | 0.5 | 0.5 | 0.5 | 0.5 | 0.5 |
| (F) solvent (wt %) | | 44 | 44 | 44 | 44 | 44 | 44 | 44 |
| (G) additive (wt %) | | 2.5 | 2.5 | 2.5 | 2.5 | 2.5 | 2.5 | 2.5 |

*denotes the amount of pigment solids based on the total amount of black pigment dispersion solution.

Evaluation 1: Evaluation of Pattern-Forming Property

The photosensitive resin compositions according to Examples 1 to 6 and Comparative Example 1 are coated to 1.5 μm thick on a glass substrate using a spin coater and then exposed to a light for 45 mJ/cm$^2$ using a pattern mask and an exposer (USHIO Inc.). The coated glass is developed with an aqueous solution diluted with 1 wt % potassium hydroxide at 23° C. for 1 minute and then cleaned with pure water for 1 minute. This 1.5 um-high pattern is cured by heating in a 220° C. oven for 30 minutes. The shape of the cured pattern is examined using an optical electron microscope. The results are provided in the following Table 2 and FIGS. 1 and 2.

<Evaluation Reference>

⊚: pattern is smooth.

Δ: pattern has a little protrusion.

Figure 2:
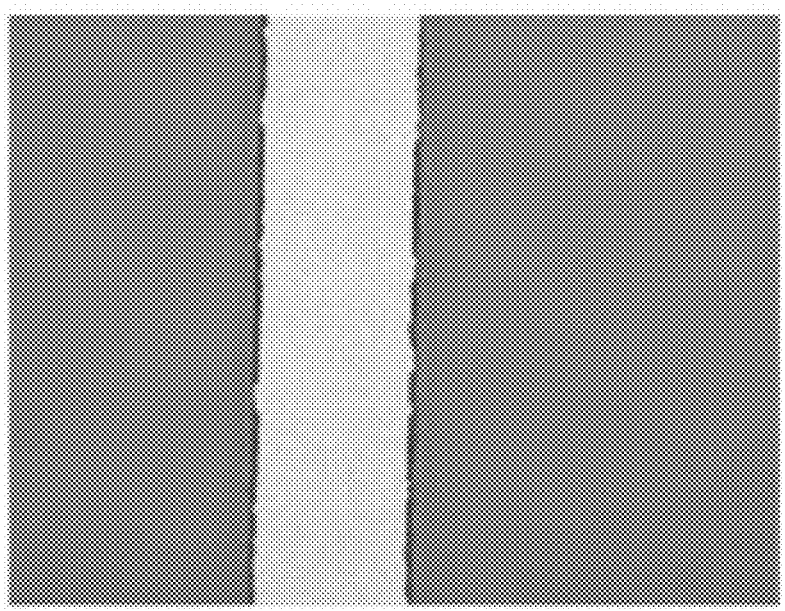
FIG. 2 is an optical microscope photograph of a shape of a pattern obtained from the photosensitive resin composition according to Comparative Example 1.
Figure 3:
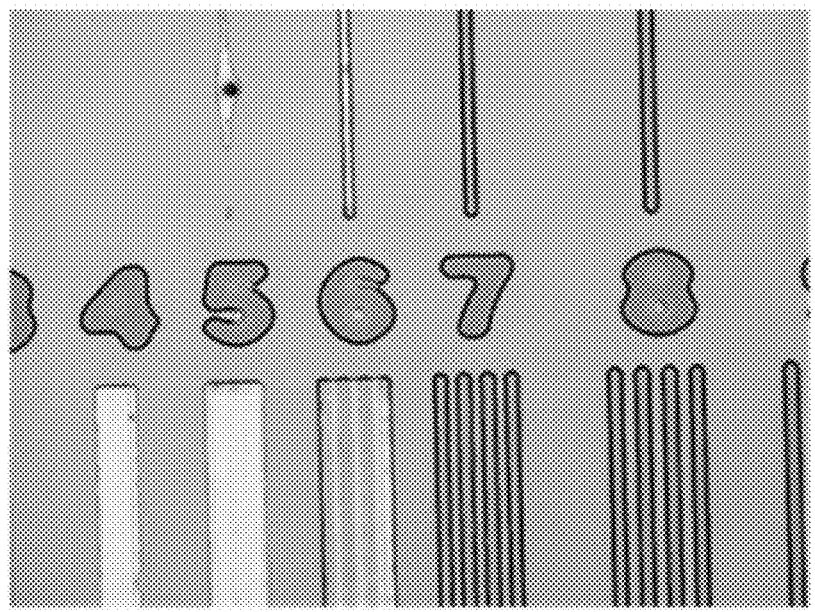
FIGS. 3 to 8 are an optical microscope photographs showing sizes of patterns obtained from the photosensitive resin compositions according to Example 1 to 6, respectively.
Figure 4:
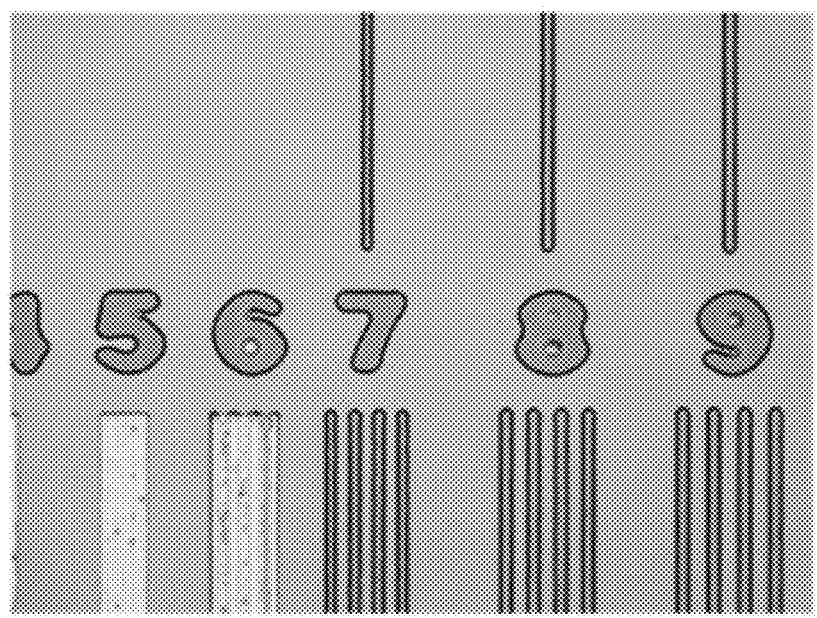
Figure 5:
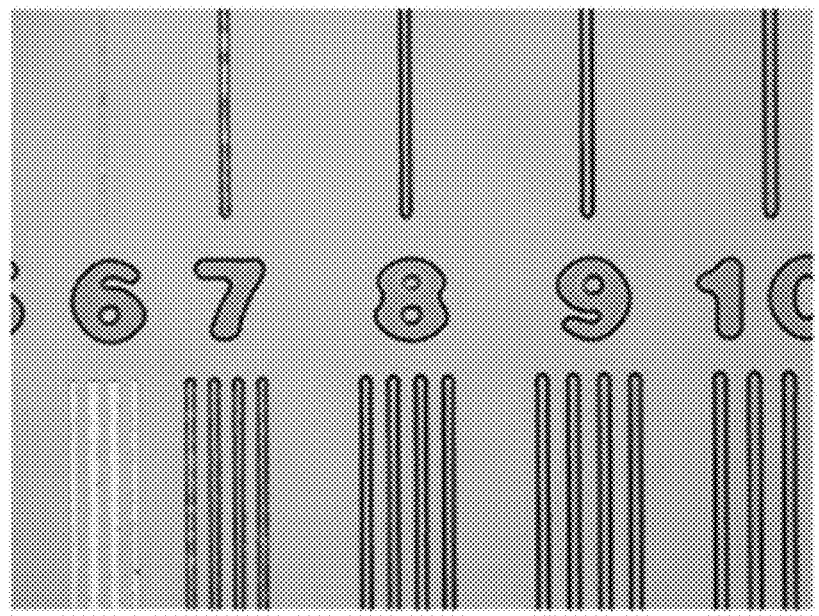
Figure 6:
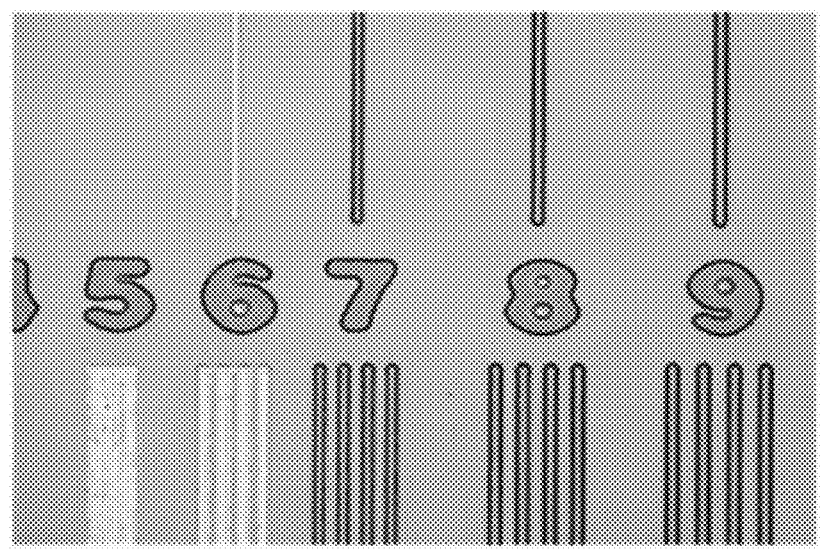
Figure 7:
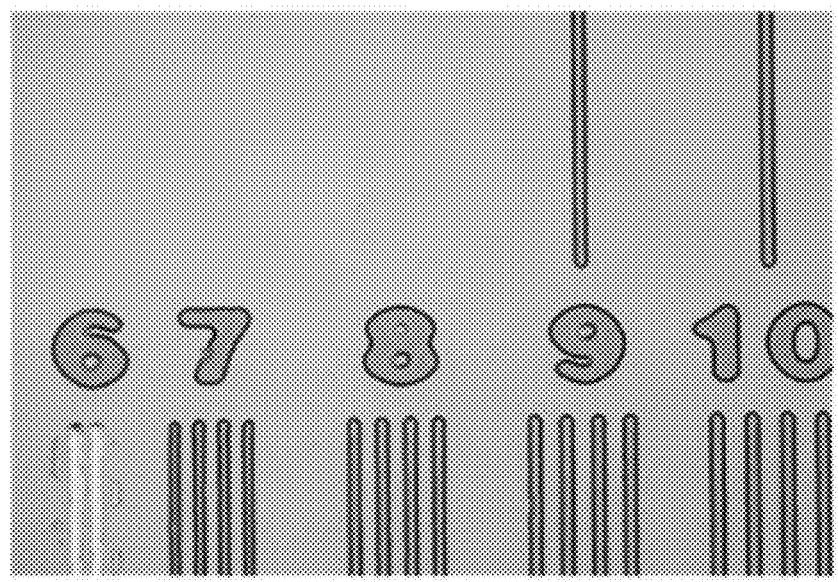
Figure 8:
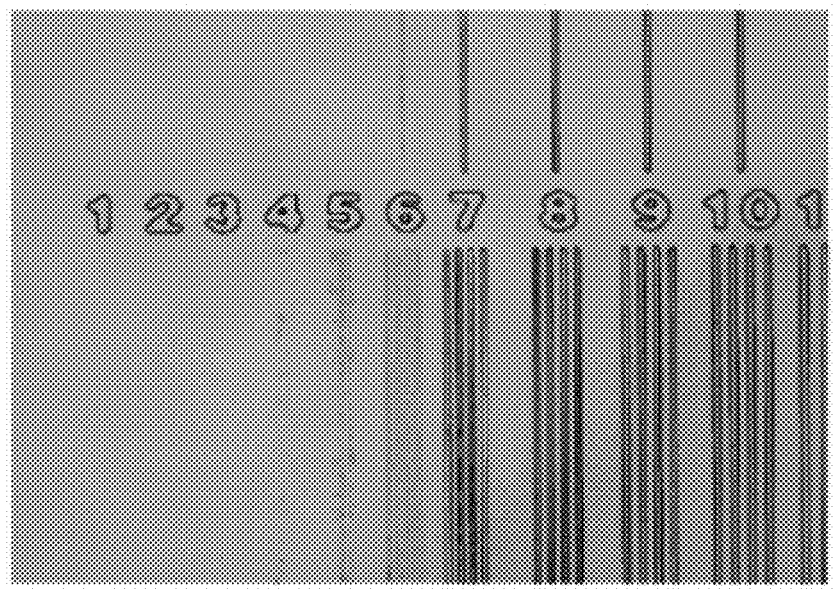

FIG. 1 is an optical microscope photograph of a shape of a pattern obtained from the photosensitive resin composition according to Example 1, and FIG. 2 is an optical microscope photograph of a shape of a pattern obtained from the photosensitive resin composition according to Comparative Example 1.

Referring to FIGS. 1 and 2, a smooth pattern is formed in Example 1, but a protrusion is formed around the pattern in Comparative Example 1.

Evaluation 2: Evaluation of Close Contacting Property Through Pattern-Forming Property of Fine Line Pattern A pattern is formed under the same conditions used to prepare a sample to evaluate the pattern-forming property using the photosensitive resin compositions prepared according to Examples 1 to 6 and Comparative Example 1, and the minimum pattern size is evaluated with an optical microscope. The results are presented in the following Table 2 and FIGS. 3 to 9.

Figure 9:
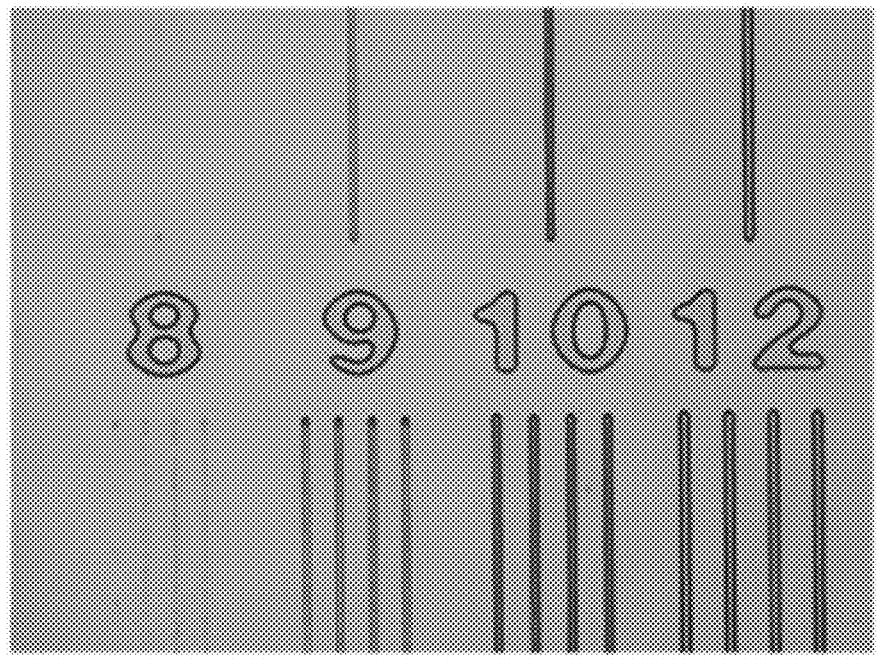
FIG. 9 is an optical microscope photograph showing a size of a pattern obtained from the photosensitive resin composition according to Comparative Example 1.

FIGS. 3 to 8 are optical microscope photographs showing the sizes of patterns obtained from the photosensitive resin composition according to Example 1 to 6, respectively, and FIG. 9 is an optical microscope photograph showing the size of a pattern obtained from the photosensitive resin composition according to Comparative Example 1.

As shown in FIGS. 3 to 9, the minimum pattern size is 7 μm for Examples 1 to 6, and the minimum pattern size is 10 μm for Comparative Example 1.

Evaluation 3: Evaluation of Sensitivity Based on the Size of Pattern Formed from a 10 μm Size Pattern A pattern is formed under the same conditions used to prepare a sample to evaluate the pattern-forming property using the photosensitive resin compositions prepared Examples 1 to 6 and Comparative Example 1, and the pattern is exposed through a photomask having a pattern size of 10 μm. The CD of the pattern is evaluated with an optical microscope. The results are shown in the following Table 2. The minimum pattern size is 10 μm for Examples 1 to 6, but the minimum pattern size is 10 μm for Comparative Example 1.

TABLE 2

| | Pattern-forming property | Minimum pattern size (μm) | Size (μm) of pattern formed from pattern of 10 μm size |
|---|---|---|---|
| Example 1 | ⊚ | 7 | 10.5 |
| Example 2 | ⊚ | 7 | 10.7 |
| Example 3 | ⊚ | 7 | 10.4 |
| Example 4 | ⊚ | 7 | 10.5 |
| Example 5 | ⊚ | 7 | 10.5 |
| Example 6 | ⊚ | 7 | 11.1 |
| Comparative Example 1 | Δ | 10 | 9.8 |

It may be seen from Table 2 that the photosensitive resin compositions according to Examples 1 to 6 including a cardo-based monomer in accordance with one embodiment of the invention can have both excellent residue and pattern-forming properties, as compared with the photosensitive resin composition of Comparative Example 1 which do not use a cardo-based monomer.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:
1. A photosensitive resin composition, comprising
(A) a cardo-based monomer represented by the following Chemical Formula 1, Chemical Formula 2, or a combination thereof;
(B) a cardo-based resin;
(C) a reactive unsaturated compound;
(D) a pigment;
(E) an initiator; and
(F) a solvent:

[Chemical Formula 1]

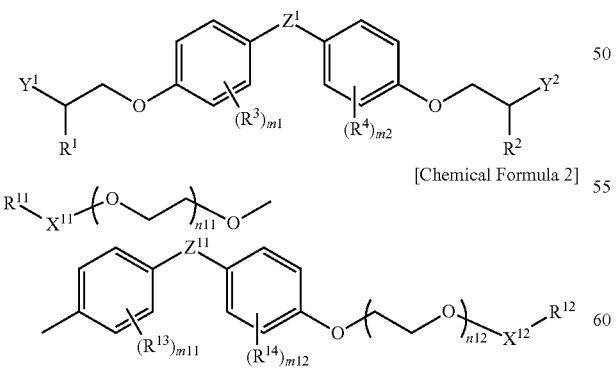

[Chemical Formula 2]

wherein, in Chemical Formulae 1 and 2,
$R^1$, $R^2$, $R^{11}$ and $R^{12}$ are the same or different and are independently an organic group including a substituted or unsubstituted (meth)acrylate group, $R^3$, $R^4$, $R^{13}$ and $R^{14}$ are the same or different and are independently hydrogen, halogen, or substituted or unsubstituted C1 to C20 alkyl, $Z^1$ and $Z^{11}$ are the same or different and are independently a single bond, O, CO, $SO_2$, $CR^6R^7$, $SiR^8R^9$ wherein $R^6$ to $R^9$ are the same or different and are independently hydrogen or substituted or unsubstituted C1 to C20 alkyl, or a linking group represented by the following Chemical Formula 4-1 to 4-11, $Y^1$ and $Y^2$ are the same or different and are independently hydroxy, a substituted or unsubstituted (meth)acrylate group, or an organic group including a carboxyl group, $X^{11}$ and $X^{12}$ are the same or different and are independently a linking group represented by the following Chemical Formula 7, and $m^1$, $m^2$, $m^{11}$ and $m^{12}$ are the same or different and are independently integers ranging from 0 to 4, and $n^{11}$ and $n^{12}$ are the same or different and are independently integers ranging from 1 to 10,

[Chemical Formula 4-1]

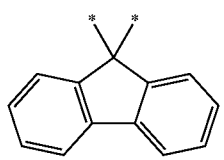

[Chemical Formula 4-2]

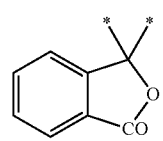

[Chemical Formula 4-3]

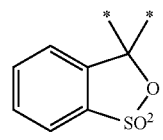

[Chemical Formula 4-4]

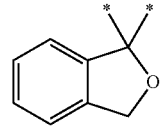

[Chemical Formula 4-5]

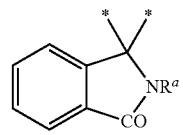

wherein in Chemical Formula 4-5,
$R^a$ is hydrogen, ethyl, $C_2H_4Cl$, $C_2H_4OH$, $CH_2CH=CH_2$, or phenyl,

[Chemical Formula 4-6]

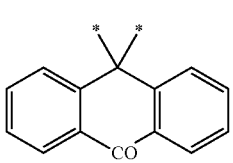

-continued

[Chemical Formula 4-7]
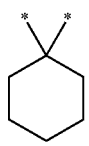

[Chemical Formula 4-8]

[Chemical Formula 4-9]

[Chemical Formula 4-10]

[Chemical Formula 4-11]

[Chemical Formula 7]
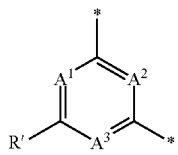

wherein, in Chemical Formula 7, $A^1$, $A^2$ and $A^3$ are the same or different and are independently carbon or nitrogen, and R' is hydrogen, halogen, hydroxy, substituted or unsubstituted C1 to C20 alkyl, amine, C1 to C20 alkylamine, or C2 to C20 alkylamine.

2. The photosensitive resin composition of claim 1, wherein in Chemical Formulae 1 and 2, $R^1$, $R^2$, $R^{11}$ and $R^{12}$ respectively comprises at least one substituent or a combination of substituents represented by the following Chemical Formulae 3-1 to 3-3:

[Chemical Formula 3-1]
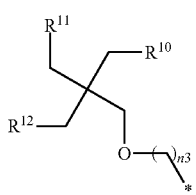

[Chemical Formula 3-2]
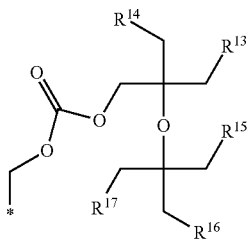

[Chemical Formula 3-3]
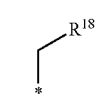

wherein, in Chemical Formulae 3-1 to 3-3, $R^{10}$ to $R^{18}$ are the same or different and are independently a substituted or unsubstituted (meth)acrylate group, and $n^3$ is an integer ranging from 0 to 3.

3. The photosensitive resin composition of claim 1, wherein the organic group including a carboxyl group comprises a substituent represented by the following Chemical Formula 5:

[Chemical Formula 5]
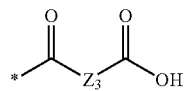

wherein, in Chemical Formula 5, $Z^3$ is a linking group represented by following Chemical Formulae 6-1 to 6-7,

[Chemical Formula 6-1]
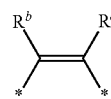

wherein, in Chemical Formula 6-1, $R^b$ and $R^c$ are the same or different and are independently hydrogen, substituted or unsubstituted C1 to C20 alkyl, ester, or ether,

[Chemical Formula 6-2]

[Chemical Formula 6-3]

[Chemical Formula 6-4]

[Chemical Formula 6-6]

[Chemical Formula 6-5]

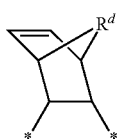

[Chemical Formula 6-7]

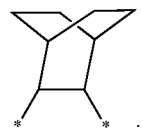

wherein, in Chemical Formula 6-5, $R^d$ is O, S, NH, substituted or unsubstituted C1 to C20 alkyl, C1 to C20 alkylamine, or C2 to C20 alkylamine, 4. The photosensitive resin composition of claim 1, wherein the cardo-based monomer (A) comprises a monomer or a combination of monomers represented by the following Chemical Formulae 8-1 to 8-6:

[Chemical Formula 8-1]

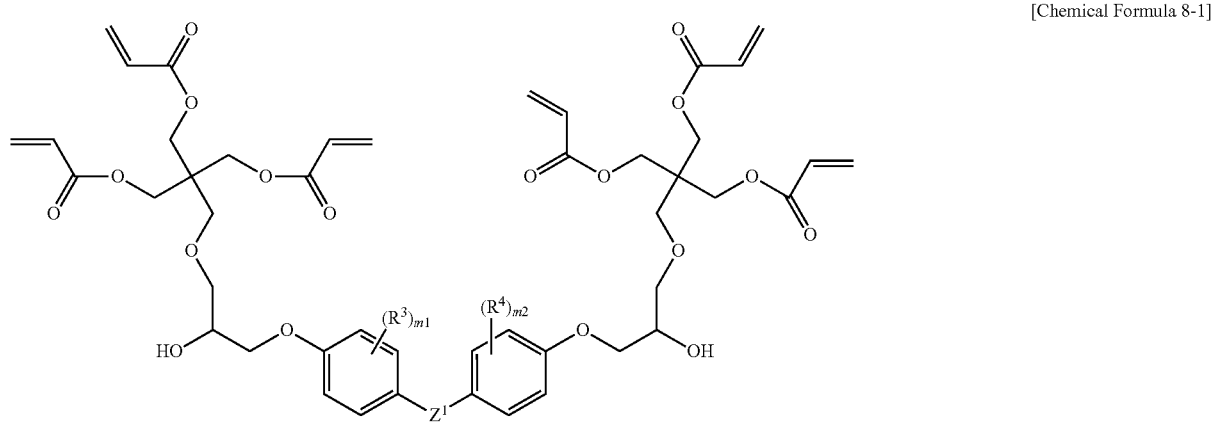

[Chemical Formula 8-2]

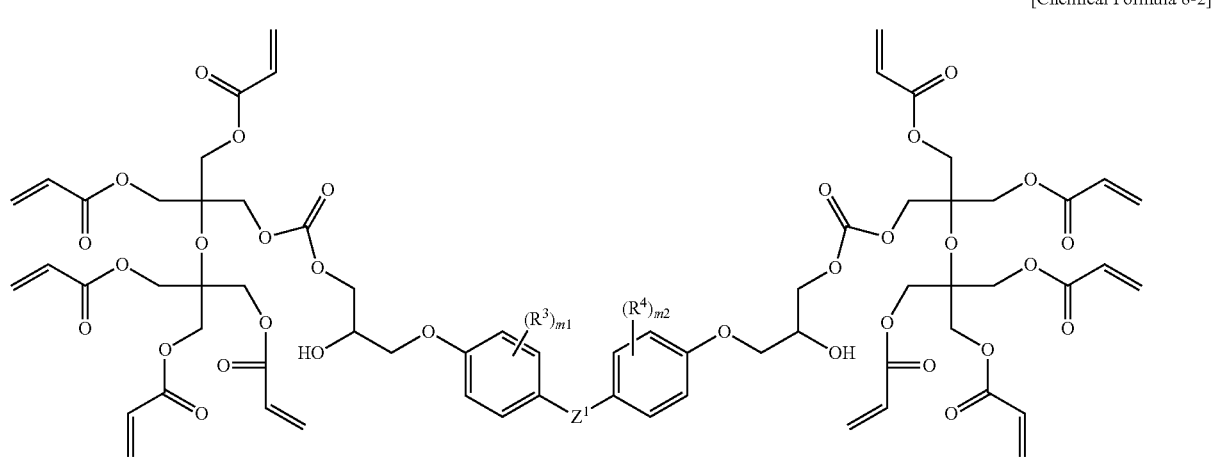

[Chemical Formula 8-3]
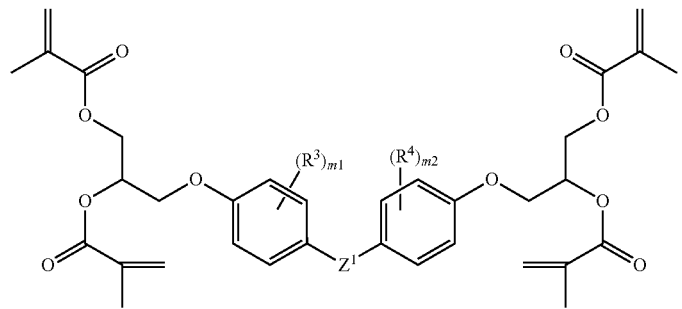
[Chemical Formula 8-4]
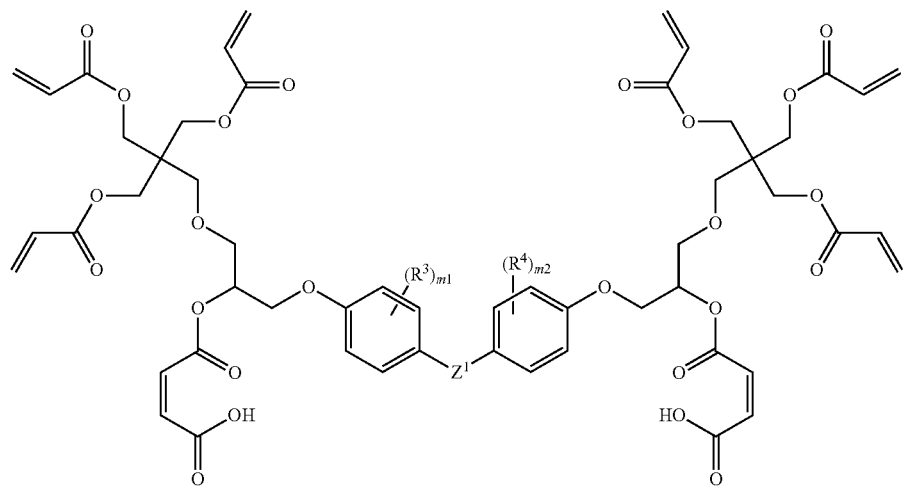
[Chemical Formula 8-5]
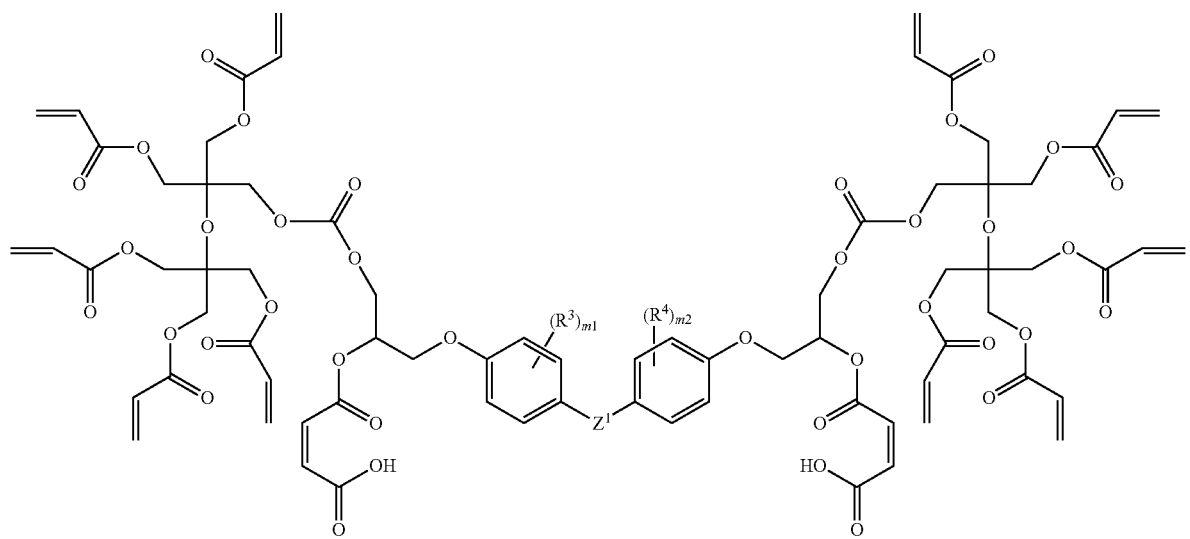

-continued

[Chemical Formula 8-6]

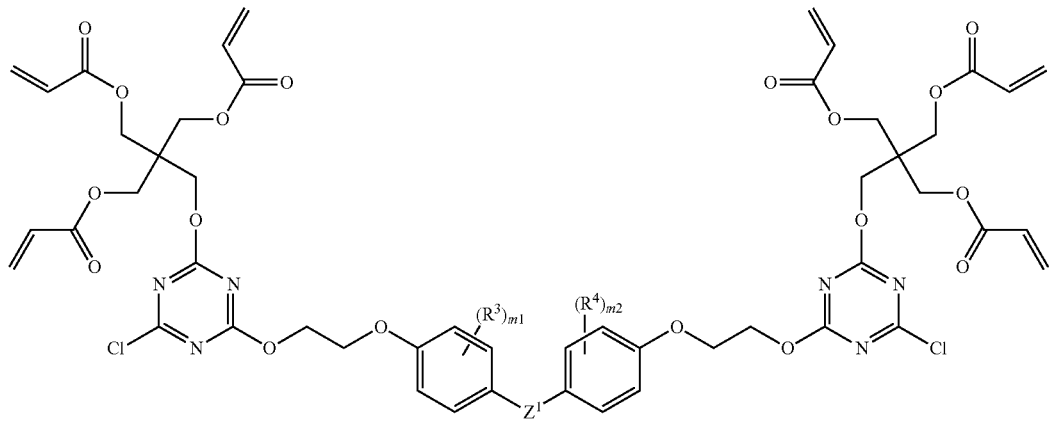

wherein, in Chemical Formulae 8-1 to 8-6, $R^3$ and $R^4$ are the same or different and are independently hydrogen, halogen, or substituted or unsubstituted C1 to C20 alkyl, $Z^1$ is a single bond, O, CO, $SO_2$, $CR^6R^7$, $SiR^8R^9$ wherein $R^6$ to $R^9$ are the same or different and are independently hydrogen or substituted or unsubstituted C1 to C20 alkyl, or a linking group represented by Chemical Formula 4-1 to 4-11, and $m^1$ and $m^2$ are the same or different and are independently integers ranging from 0 to 4.

5. The photosensitive resin composition of claim 1, wherein the cardo-based resin (B) is a polymer including a repeating unit represented by the following Chemical Formula 9:

[Chemical Formula 9]

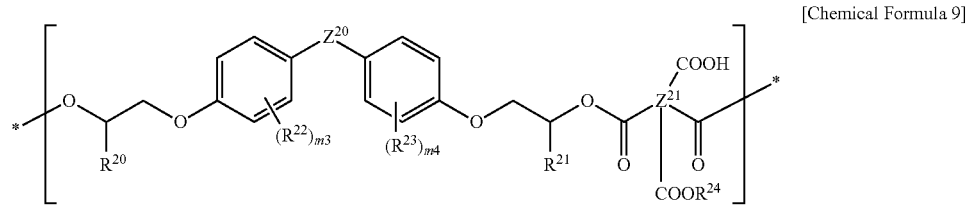

wherein, in Chemical Formula 9,
$R^{20}$ and $R^{21}$ are the same or different and are independently hydrogen or a substituted or unsubstituted (meth)acrylate group,
$R^{22}$ and $R^{23}$ are the same or different and are independently hydrogen, halogen, or substituted or unsubstituted C1 to C20 alkyl,
$R^{24}$ is hydrogen, substituted or unsubstituted C1 to C20 alkyl, or substituted or unsubstituted (meth)acrylate,
$Z^{20}$ is a single bond, O, CO, $SO_2$, $CR^{25}R^{26}$, $SiR"R"$ wherein $R^{25}$ to $R^{28}$ are the same or different and are independently hydrogen or substituted or unsubstituted C1 to C20 alkyl, or a linking group represented by the following Chemical Formula 10-1 to 10-11, and $Z^{21}$ is an acid anhydride residual group or an acid dianhydride residual group,

[Chemical Formula 10-1]

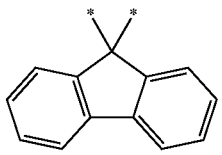

[Chemical Formula 10-2]

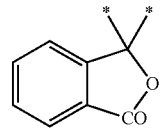

-continued

[Chemical Formula 10-3]

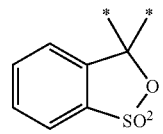

[Chemical Formula 10-4]

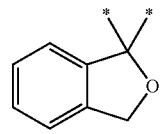

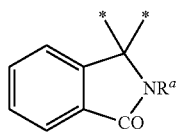

[Chemical Formula 10-5]

wherein, in Chemical Formula 10-5,
$R^a$ is hydrogen, ethyl, $C_2H_4Cl$, $C_2H_4OH$, $CH_2CH=CH_2$, or phenyl,

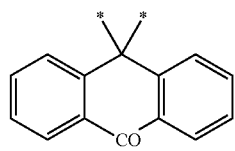

[Chemical Formula 10-6]

[Chemical Formula 10-7]

[Chemical Formula 10-8]

[Chemical Formula 10-9]

[Chemical Formula 10-10]

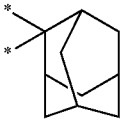

[Chemical Formula 10-11]

6. The photosensitive resin composition of claim 1, wherein the cardo-based resin (B) has a weight average molecular weight of about 500 to about 50,000 g/mol.

7. The photosensitive resin composition of claim 1, wherein the photosensitive resin composition comprises
about 1 to about 30 wt % of the cardo-based monomer (A);
about 1 to about 30 wt % of the cardo-based resin (B);
about 1 to about 30 wt % of the reactive unsaturated compound (C);
about 1 to about 30 wt % of the pigment (D);
about 0.01 to about 10 wt % of the initiator (E); and
a balance amount of the solvent (F).

8. The photosensitive resin composition of claim 1, wherein the photosensitive resin composition further comprises an acrylic-based resin.

9. The photosensitive resin composition of claim 8, wherein the acrylic-based resin comprises a copolymer of a first ethylenic unsaturated monomer comprising (meth)acrylic acid, maleic acid, itaconic acid, fumaric acid, or a combination thereof; and a second ethylenic unsaturated monomer comprising styrene, α-methylstyrene, vinyltoluene, vinylbenzylmethylether, methyl(meth)acrylate, ethyl (meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, 2-aminoethyl(meth)acrylate, 2-dimethylaminoethyl(meth)acrylate, vinyl acetate, vinyl benzoate, glycidyl(meth)acrylate, (meth)acrylonitrile, (meth)acrylamide, or a combination thereof.

10. The photosensitive resin composition of claim 8, wherein the acrylic-based resin has a weight average molecular weight of about 3,000 to about 40,000 g/mol.

11. The photosensitive resin composition of claim 8, comprising the cardo-based resin (B) and the acrylic-based resin in a weight ratio of about 99:1 to about 1:99.

12. The photosensitive resin composition of claim 1, wherein the initiator (E) comprises a photopolymerization initiator, a radical polymerization initiator, or a combination thereof.

13. The photosensitive resin composition of claim 1, wherein the photosensitive resin composition further comprises about 0.01 to about 5 parts by weight of an epoxy compound based on about 100 parts by weight of the photosensitive resin composition.

14. A light blocking layer manufactured using the photosensitive resin composition of claim 1.

15. The photosensitive resin composition of claim 1, wherein at least one of $R^1$ or $R^2$ includes at least two (meth)acrylate groups.

16. The photosensitive resin composition of claim 1, wherein both of $R^1$ and $R^2$ includes at least two (meth)acrylate groups.

17. The photosensitive resin composition of claim 1, wherein at least one of $R^1$ or $R^2$ includes at least three (meth)acrylate groups.

18. The photosensitive resin composition of claim 1, wherein both of $R^1$ and $R^2$ includes at least three (meth)acrylate groups.

* * * * *

UNITED STATES PATENT AND TRADEMARK OFFICE
CERTIFICATE OF CORRECTION

PATENT NO.         : 8,298,454 B2                                Page 1 of 2
APPLICATION NO.    : 13/241434
DATED              : October 30, 2012
INVENTOR(S)        : Chang-Min Lee et al.

It is certified that error appears in the above-identified patent and that said Letters Patent is hereby corrected as shown below:

In the Specification

Column 4, Line 31 reads: "C20 alkylamine." and should read: "C20 allylamine."

Column 6, Line 16 reads: "C20 alkylamine." and should read: "C20 allylamine."

Column 6, Line 31 reads: "8-1 to 0.8-6 or a combination thereof." and should read: "8-1 to 8-6 or a combination thereof."

Column 14, Line 27 reads: "$CR^6R^7$, $SiR^6R^9$ (wherein $R^6$ to $R^9$ are the same or different" and should read: "$CR^6R^7$, $SiR^8R^9$ (wherein $R^6$ to $R^9$ are the same or different"

Column 16, Line 47 reads: "C2 to C20 alkylamine." and should read: "C2 to C20 allylamine."

Column 17, Line 14 reads: "C20 alkylamine, and the like." and should read: "C20 allylamine, and the like."

Column 41, Table 1, under the heading (D) pigment dispersion reads:

| (D) pigment dispersion (wt%) | 406* | 406* | 406* | 406* | 406* | 406* | 406* | and it should read:

| (D) pigment dispersion (wt%) | 40 6* | 40 6* | 40 6* | 40 6* | 40 6* | 40 6* | 40 6* |

Signed and Sealed this
Nineteenth Day of February, 2013

Teresa Stanek Rea
*Acting Director of the United States Patent and Trademark Office*

CERTIFICATE OF CORRECTION (continued)
U.S. Pat. No. 8,298,454 B2

<u>In the Claims</u>

Column 45, Line 51, Claim 1 reads: "C2 to C20 alkylamine." and should read: "C2 to C20 allylamine."

Column 47, Line 22, Claim 3 reads: "lamine, or C2 to C20 alkylamine," and should read: "lamine, or C2 to C20 allylamine,"

Column 51, Line 63, Claim 5 reads: "$Z^{20}$ is a single bond, O, CO, $SO_2$, $CR^{25}R^{26}$, SiR"R" and should read: "$Z^{20}$ is a single bond, O, CO, $SO_2$, $CR^{25}R^{26}$, $SiR^{27}R^{28}$"